US009369788B1

(12) United States Patent
Ho et al.

(10) Patent No.: US 9,369,788 B1
(45) Date of Patent: Jun. 14, 2016

(54) MEMS MICROPHONE PACKAGE

(71) Applicant: INDUSTRIAL TECHNOLOGY RESEARCH INSTITUTE, Hsinchu (TW)

(72) Inventors: Tzong-Che Ho, Hsinchu (TW); Yu-Wen Fan, Hsinchu (TW); Hong-Ren Chen, Hsinchu (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/586,086

(22) Filed: Dec. 30, 2014

(30) Foreign Application Priority Data

Dec. 5, 2014 (TW) .............................. 103142466 A

(51) Int. Cl.
*H04R 1/02* (2006.01)
*B81B 7/00* (2006.01)
(Continued)

(52) U.S. Cl.
CPC ................ *H04R 1/021* (2013.01); *B81B 7/007* (2013.01); *B81B 7/0064* (2013.01); *H04R 1/04* (2013.01); *H04R 1/342* (2013.01); *B81B 2201/0257* (2013.01); *H04R 23/00* (2013.01); *H04R 2201/003* (2013.01); *H04R 2499/11* (2013.01)

(58) Field of Classification Search
CPC ............ H04R 1/04; H04R 1/08; H04R 1/021; H04R 1/083; H04R 1/342; H04R 2225/49; H04R 2499/11; H01L 2924/1461; B81B 2201/0257; B81B 2207/092; B81B 2207/093
See application file for complete search history.

(56) References Cited

U.S. PATENT DOCUMENTS 6,781,231 B2  8/2004  Minervini
7,166,910 B2  1/2007  Minervini
(Continued)

FOREIGN PATENT DOCUMENTS

CN    102730623 A    10/2012
CN    202679629 U    1/2013
(Continued)

OTHER PUBLICATIONS

Alfons Dehe, Silicon microphone development and application, Sensors and Actuators A, 2007, pp. 283-287, vol. 133.
(Continued)

*Primary Examiner* — Curtis Kuntz
*Assistant Examiner* — Joshua Kaufman
(74) *Attorney, Agent, or Firm* — Locke Lord LLP; Tim Tingkang Xia, Esq.

(57) ABSTRACT

An MEMS microphone package includes a substrate, an MEMS microphone, an IC chip and an electrically conductive cover. The substrate includes a first hole, an upper surface, a bottom surface, a side surface, a first electrically conductive layer and a second electrically conductive layer. The side surface has two sides connected to the upper surface and the bottom surface, respectively. The first electrically conductive layer is disposed on the upper surface. The second electrically conductive layer is disposed on the bottom surface. The MEMS microphone is electrically coupled to the substrate. The IC chip is electrically coupled to the substrate. The electrically conductive cover includes a second hole. The electrically conductive cover is bonded to the substrate to form a chamber for accommodating the MEMS microphone and the IC chip. The first hole and the second hole together form an acoustic hole.

39 Claims, 19 Drawing Sheets

(51) Int. Cl.
*H04R 1/04* (2006.01)
*H04R 1/34* (2006.01)
*H04R 23/00* (2006.01)

(56) References Cited

U.S. PATENT DOCUMENTS

| | | | | |
|---|---|---|---|---|
| 7,434,305 | B2* | 10/2008 | Minervini | B81B 7/0061 216/62 |
| 7,550,828 | B2 | 6/2009 | Ramakrishna et al. | |
| 7,763,488 | B2* | 7/2010 | Goodelle | B81C 1/00333 257/704 |
| 7,902,843 | B2* | 3/2011 | Fang | G01L 9/0073 324/658 |
| 8,018,049 | B2 | 9/2011 | Minervini | |
| 8,121,331 | B2 | 2/2012 | Minervini | |
| 8,351,634 | B2* | 1/2013 | Khenkin | H04R 19/005 257/415 |
| 8,354,747 | B1* | 1/2013 | Kuo | B81B 7/0061 257/684 |
| 8,358,004 | B2 | 1/2013 | Minervini | |
| 8,617,934 | B1 | 12/2013 | Minervini | |
| 8,618,619 | B1* | 12/2013 | Miks | H04R 1/021 257/414 |
| 8,623,709 | B1 | 1/2014 | Minervini | |
| 8,623,710 | B1 | 1/2014 | Minervini | |
| 8,624,384 | B1 | 1/2014 | Minervini | |
| 8,624,385 | B1 | 1/2014 | Minervini | |
| 8,624,386 | B1 | 1/2014 | Minervini | |
| 8,624,387 | B1 | 1/2014 | Minervini | |
| 8,629,005 | B1 | 1/2014 | Minervini | |
| 8,629,551 | B1 | 1/2014 | Minervini | |
| 8,629,552 | B1 | 1/2014 | Minervini | |
| 8,633,064 | B1 | 1/2014 | Minervini | |
| 8,704,360 | B1 | 4/2014 | Minervini | |
| 8,705,776 | B2 | 4/2014 | Knauss et al. | |
| 8,742,569 | B2 | 6/2014 | Lo et al. | |
| 8,823,115 | B2* | 9/2014 | Inoda | H04R 19/04 257/416 |
| 9,162,869 | B1* | 10/2015 | Chen | B81B 3/0221 |
| 2007/0252261 | A1 | 11/2007 | Wang et al. | |
| 2008/0083960 | A1* | 4/2008 | Chen | H04R 1/04 257/416 |
| 2008/0283988 | A1* | 11/2008 | Huang | B81B 7/007 257/680 |
| 2009/0115430 | A1* | 5/2009 | Fang | G01L 9/0073 324/686 |
| 2009/0180655 | A1* | 7/2009 | Tien | H04R 1/086 381/361 |
| 2010/0086146 | A1* | 4/2010 | Gong | B81C 1/0023 381/91 |
| 2010/0128914 | A1* | 5/2010 | Khenkin | H04R 19/005 381/361 |
| 2010/0142743 | A1* | 6/2010 | Tanaka | H04R 1/04 381/346 |
| 2010/0202649 | A1* | 8/2010 | Inoda | H04R 1/021 381/361 |
| 2011/0062573 | A1* | 3/2011 | Zhe | B81C 1/00301 257/680 |
| 2011/0156176 | A1* | 6/2011 | Huckabee | B81B 7/0061 257/414 |
| 2011/0176698 | A1* | 7/2011 | Tanaka | H04R 1/38 381/355 |
| 2011/0180924 | A1* | 7/2011 | Tian | B81B 7/0061 257/704 |
| 2012/0001275 | A1* | 1/2012 | Chi | B81C 1/00309 257/415 |
| 2012/0008805 | A1* | 1/2012 | Hachinohe | B81B 7/0064 381/163 |
| 2012/0205755 | A1* | 8/2012 | Yueh | B81B 7/0061 257/416 |
| 2012/0257777 | A1* | 10/2012 | Tanaka | H04R 19/04 381/355 |
| 2012/0287303 | A1* | 11/2012 | Umeda | H04R 3/005 348/231.4 |
| 2012/0300969 | A1* | 11/2012 | Tanaka | H04R 19/005 381/355 |
| 2012/0319256 | A1* | 12/2012 | Lo | B81B 7/0061 257/666 |
| 2013/0051598 | A1* | 2/2013 | Reining | B81B 7/0061 381/355 |
| 2013/0129133 | A1* | 5/2013 | Inoda | H04R 1/08 381/337 |
| 2013/0129136 | A1* | 5/2013 | Harney | H04R 1/342 381/355 |
| 2013/0136292 | A1* | 5/2013 | Inoda | H04R 1/38 381/355 |
| 2013/0163790 | A1* | 6/2013 | Shimizu | H04R 3/00 381/122 |
| 2013/0241045 | A1* | 9/2013 | Goida | B81B 7/0061 257/704 |
| 2014/0001580 | A1* | 1/2014 | Bolognia | B81C 1/00333 257/416 |
| 2014/0044297 | A1* | 2/2014 | Loeppert | H04R 1/04 381/355 |
| 2014/0291784 | A1* | 10/2014 | Conklin | H04R 19/005 257/416 |
| 2015/0117681 | A1* | 4/2015 | Watson | H04R 1/04 381/174 |

FOREIGN PATENT DOCUMENTS

| | | |
|---|---|---|
| CN | 203407016 U | 1/2014 |
| CN | 203492197 U | 3/2014 |
| TW | 201016037 A | 4/2010 |
| TW | I323242 B | 4/2010 |

OTHER PUBLICATIONS

Gregor Feiertag et al., Determining the acoustic resistance of small sound holes for MEMS microphones, Procedia Engineering, 2011, pp. 1509-1512, vol. 25.

Gregor Feiertag et al., Flip chip MEMS microphone package with large acoustic reference volume, Procedia Engineering, 2010, pp. 355-358, vol. 5.

Intellectual Property Office, Ministry of Economic Affairs, R. O. C, Office Action, Mar. 31, 2016, Taiwan.

* cited by examiner

MEMS MICROPHONE PACKAGE

CROSS-REFERENCE TO RELATED APPLICATIONS

This non-provisional application claims priority under 35 U.S.C. §119(a) on Patent Application No(s). 103142466 filed in Taiwan, R.O.C. on Dec. 5, 2014, the entire contents of which are hereby incorporated by reference.

TECHNICAL FIELD

The disclosure relates to an MEMS microphone package.

BACKGROUND

In recent years, handsets, e.g. smartphones, have adopted more than one microelectromechanical system (MEMS) microphone sensors inside for eliminating background noises during communication, and therefore the demand of the MEMS microphone packages are increased rapidly. So far, there are only few major suppliers of the MEMS microphone in the global market, and these MEMS microphone sensors are one of the most important products in the MEMS markets in the future.

Generally speaking, the package of the MEMS microphone comprises a substrate, an MEMS microphone, an integrated circuit (IC) chip and a cover. Both the MEMS microphone and the IC chip are electrically coupled to the substrate, and the cover is disposed on the substrate. Thus, the MEMS microphone and the IC chip are disposed within a chamber formed by the substrate and the cover.

Since current electronic products have been developed to be miniaturized, the thickness of the MEMS microphone package is also reduced accordingly. Therefore, manufacturers try to develop the MEMS microphone packages with not only better sound quality but also smaller thickness.

SUMMARY

An aspect of the disclosure provides an MEMS microphone package, comprising a substrate, at least one MEMS microphone, at least one IC chip and an electrically conductive cover. The substrate comprises at least one first hole, an upper surface, a bottom surface, a side surface, at least one first electrically conductive layer and at least one second electrically conductive layer. The side surface has two sides connected to the upper surface and the bottom surface, respectively, and the two sides are opposite to each other. The at least one first electrically conductive layer is disposed on the upper surface. The at least one second electrically conductive layer is disposed on the bottom surface. The at least one MEMS microphone is electrically coupled to the substrate. The at least one IC chip is electrically coupled to the substrate. The electrically conductive cover comprises at least one second hole. The electrically conductive cover is bonded to the substrate to form a chamber for accommodating the MEMS microphone and the IC chip. The at least one first hole and the at least one second hole together form at least one acoustic hole.

Another aspect of the disclosure provides an MEMS microphone package, comprising a substrate, at least one MEMS microphone, at least one IC chip and an electrically conductive cover. The substrate comprises at least one first hole, an upper surface, a bottom surface, a side surface, at least one first electrically conductive layer and at least one second electrically conductive layer. The side surface has two sides connected to the upper surface and the bottom surface, respectively, and the two sides are opposite to each other. The at least one first electrically conductive layer is disposed on the upper surface. The at least one second electrically conductive layer is disposed on the bottom surface. The at least one MEMS microphone is electrically coupled to the substrate. The at least one IC chip is electrically coupled to the substrate. The electrically conductive cover comprises at least one second hole. The electrically conductive cover is bonded to the substrate to form a chamber for accommodating the MEMS microphone and the IC chip, the at least one first hole and the at least one second hole together form at least one acoustic hole, and one part of a boundary of the at least one first hole is disposed on the upper surface and is not on a same plane with one part of a boundary of the at least one second hole.

Yet another aspect of the disclosure provides an MEMS microphone package, comprising a substrate, at least one MEMS microphone, at least one IC chip and an electrically conductive cover. The substrate comprises at least one first hole, an upper surface, a bottom surface, a side surface, at least one first electrically conductive layer, at least one second electrically conductive layer and at least one third electrically conductive layer. The side surface has two sides connected to the upper surface and the bottom surface, respectively, and the two sides are opposite to each other. The at least one first electrically conductive layer is disposed on the upper surface. The at least one second electrically conductive layer is disposed on the bottom surface. The at least one MEMS microphone electrically is coupled to the substrate. The at least one IC chip is electrically coupled to the substrate. The electrically conductive cover comprises at least one second hole. The electrically conductive cover is bonded to the substrate to form a chamber for accommodating the MEMS microphone and the IC chip, and the at least one first hole and the at least one second hole together form at least one acoustic hole. The at least one third electrically conductive layer is disposed on at least one surface of the first hole, the at least one third electrically conductive layer is electrically coupled to the electrically conductive cover, and the at least one third electrically conductive layer is electrically coupled to an electrical ground layer such that the electrically conductive cover and the at least one third electrically conductive layer together form a shield for preventing electromagnetic interference.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1A:
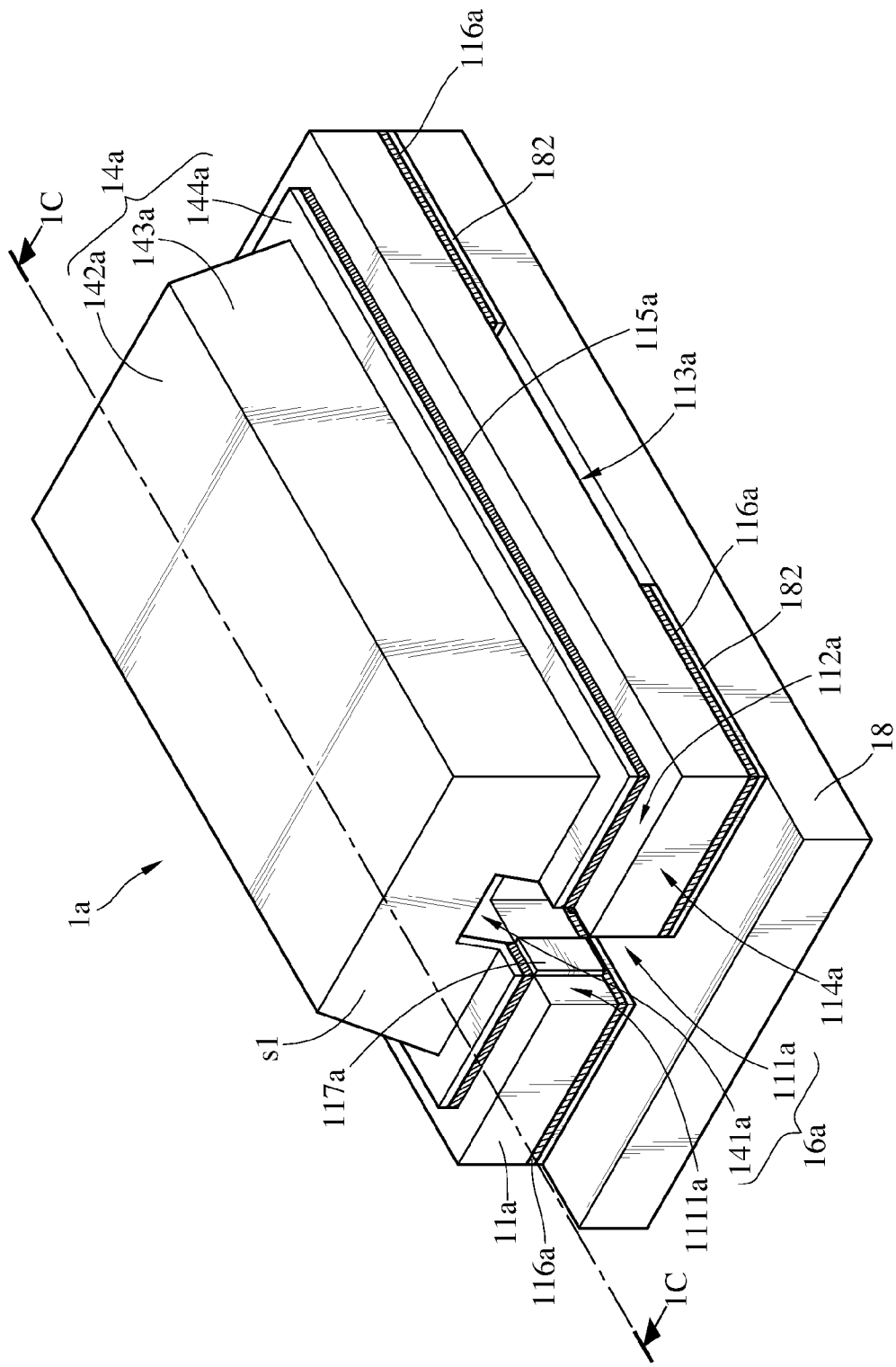
FIG. 1A is a schematic perspective view of an MEMS microphone package according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the following embodiments of the disclosure, boundaries of first holes 111a, 111b, 111c, 111d of substrates 11a, 11b, 11c, 11d are formed by connecting the sidelines (i.e., segments) on surfaces of the substrates. In other words, the ranges of the first holes are enclosed by the sidelines of the surfaces of the substrates (i.e., thick lines in FIG. 3A through FIG. 3D). Similarly, boundaries of second holes 141a, 141b, 141c of electrically conductive covers 14a, 14b, 14c are formed by connecting the sidelines of electrically conductive covers 14a, 14b, 14c. That is, the ranges of the second holes are enclosed by sidelines of the electrically conductive cover (i.e., thick lines in FIG. 2A through FIG. 2C).

Figure 1B:
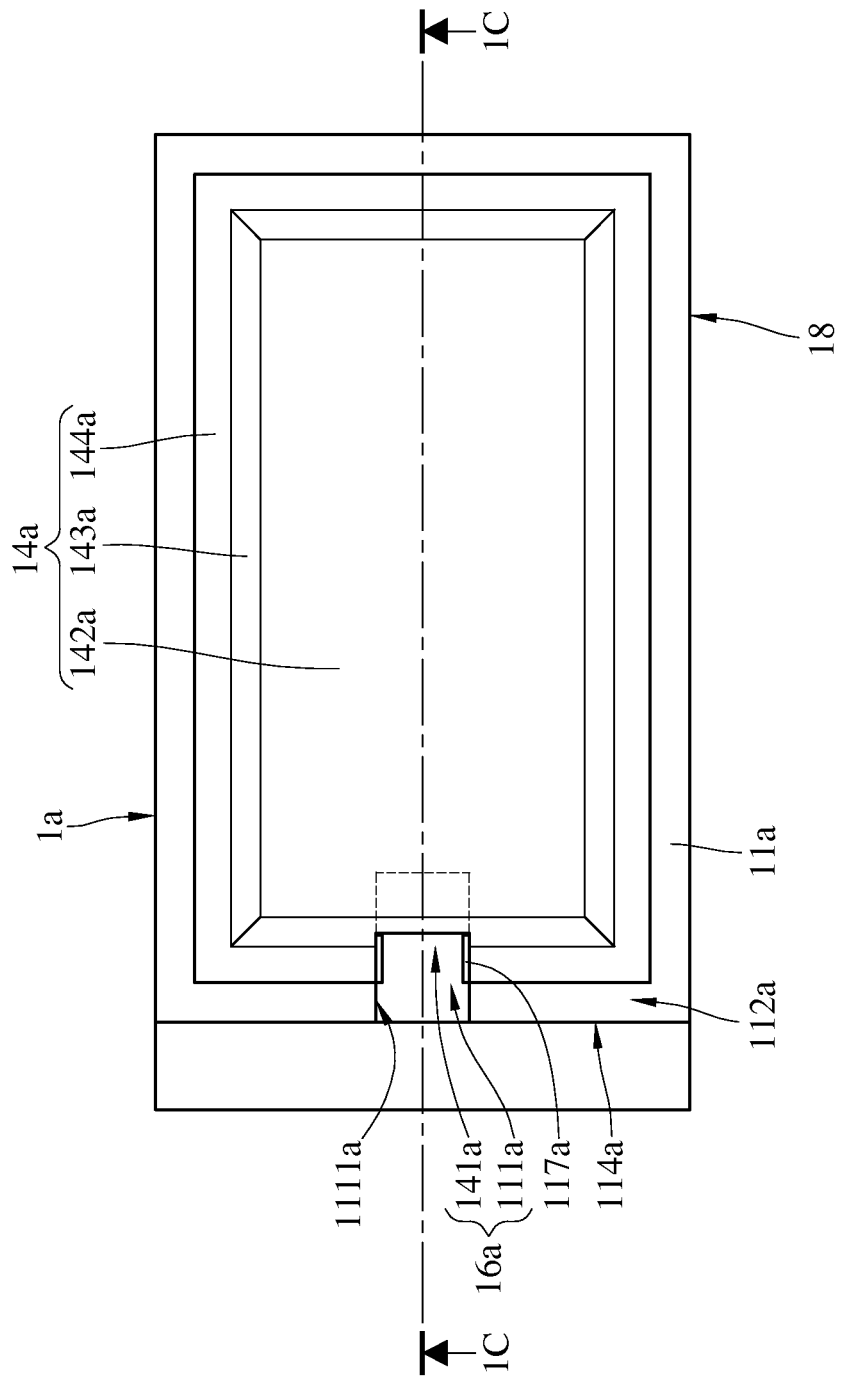
FIG. 1B is a top view of FIG. 1A.
Figure 1C:
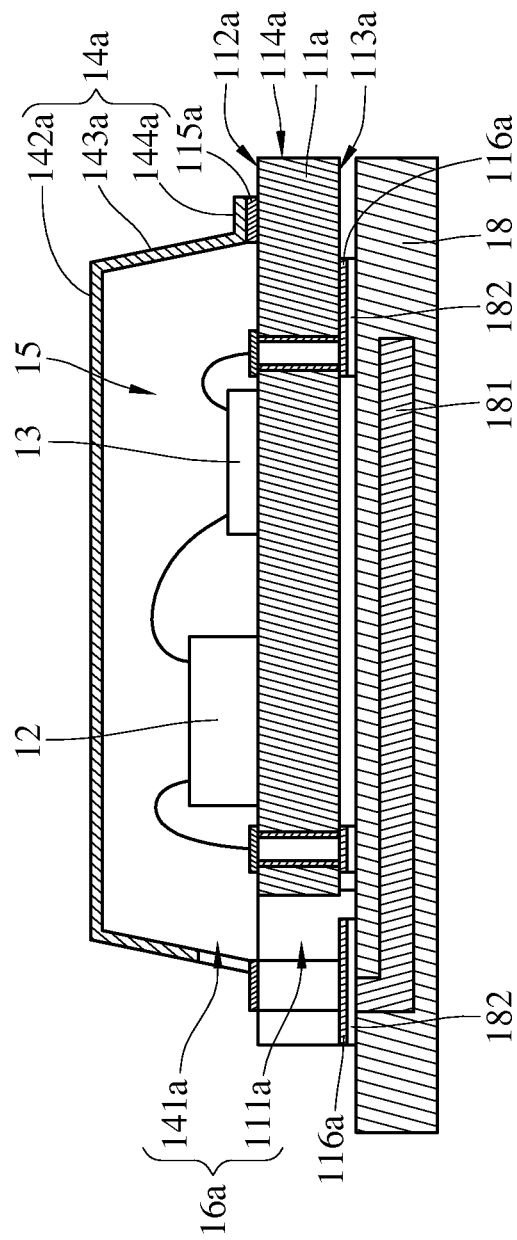
FIG. 1C is a cross-sectional view of the MEMS microphone package of FIG. 1A disposed on a printed circuit board.

Please refer to FIG. 1A through FIG. 1C, FIG. 1A is a schematic perspective view of an MEMS microphone package according to a first embodiment of the disclosure, FIG. 1B is a top view of FIG. 1A, and FIG. 1C is a cross-sectional view of the MEMS microphone package of FIG. 1A disposed on a printed circuit board. In this embodiment, the MEMS microphone package 1a comprises a substrate 11a, an MEMS microphone 12, at least one IC chip 13 and an electrically conductive cover 14a. In addition, the MEMS microphone package 1a has an outer surface s1.

The substrate 11a comprises at least one first hole 111a and a surface 1111a which is one of the surfaces of the first hole 111a. The MEMS microphone 12 is electrically coupled to the substrate 11a. However, the embodiment of the disclosure is not limited to the quantity of the MEMS microphone 12. In other embodiments, the quantity of the MEMS microphones 12 is more than one.

In this embodiment, the IC chip 13 is electrically coupled to the substrate 11a. The quantity of the IC chip 13 is, but not limited to, one. In other embodiments, for example, the quantity of the IC chips 13 is more than one.

The electrically conductive cover 14a comprises at least one second hole 141a. The electrically conductive cover 14a is bonded to the substrate 11a to form a chamber 15 for accommodating the MEMS microphone 12 and the IC chip 13. The first hole 111a and the second hole 141a form an acoustic hole 16a together. It is shown in FIG. 1A that one part of the boundary of the first hole 111a and one part of the boundary of the second hole 141a are not formed on a same plane. In details, the part of the boundary of the first hole 111a and the part of the boundary of the second hole 141a are disposed on different planes of different objects (i.e., on the electrically conductive cover 14a and the surface of the substrate 11a), respectively. Also, the plane of the electrically conductive cover 14a on which the second hole 141a is disposed is not parallel to the surface of the substrate 11a on which the first hole 111a is disposed. In addition, the acoustic hole 16a formed by the first hole 111a and the second hole 141a communicates with the chamber 15 such that the MEMS microphone 12 within the chamber 15 is capable of receiving external acoustic waves generated outside the MEMS microphone package 1a. In addition, the quantity of the acoustic hole 16a in this embodiment is one, and the acoustic hole 16a is disposed on a side of the MEMS microphone package 1a. Thus, the MEMS microphone package 1a has enhanced directional function when receiving sound.

Figure 1D:
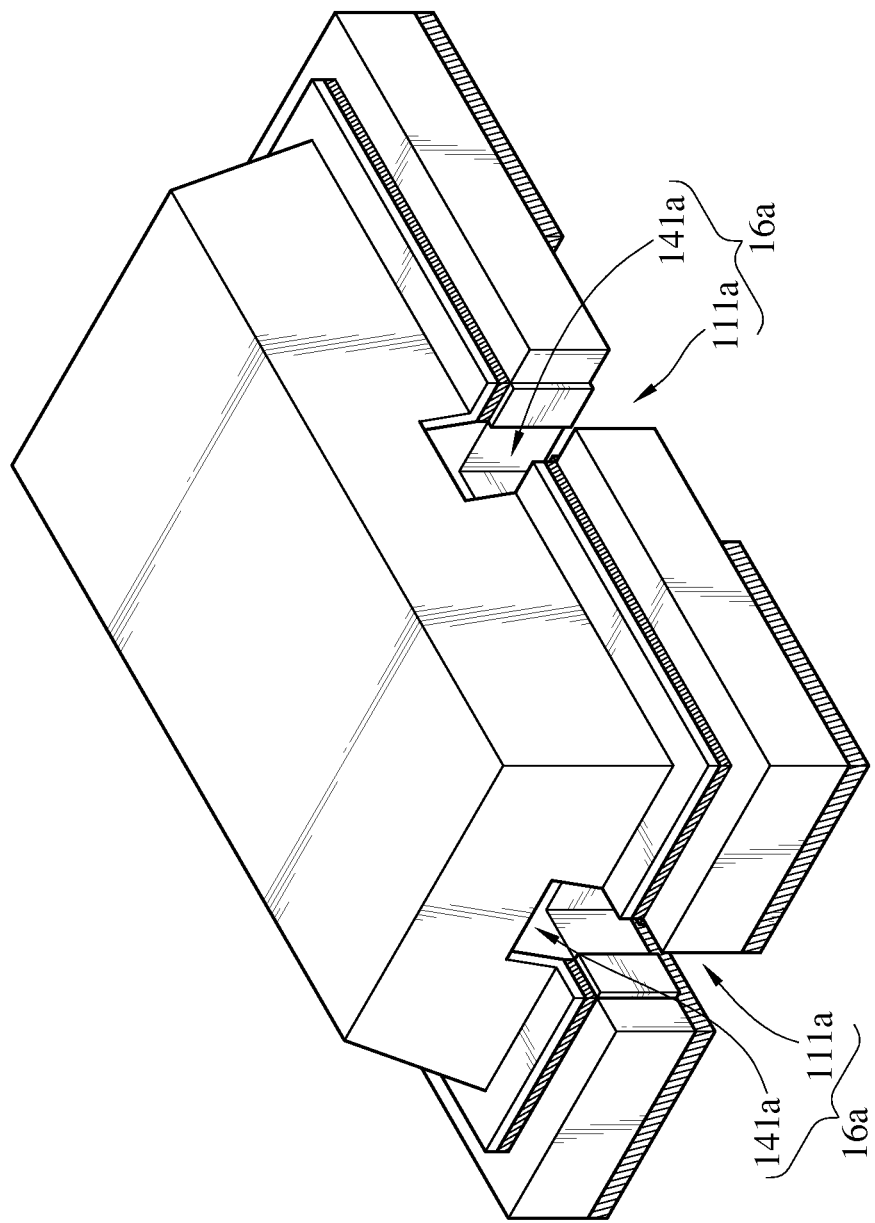
FIG. 1D is a schematic perspective view of an MEMS microphone package according to a second embodiment of the disclosure.

Please refer to FIG. 1A through FIG. 1D, which is a schematic perspective view of an MEMS microphone package according to an embodiment of the disclosure. In the above-mentioned first embodiment, the quantity of the acoustic hole 16a of the MEMS microphone package 1a is one, but the disclosure is not limited to the quantity of the acoustic hole. Referring to FIG. 1D, in this embodiment, the quantity of the acoustic holes 16a is two. The acoustic holes 16a of the MEMS microphone package 1a are located at two different sides of the MEMS microphone package 1a. Thus, the MEMS microphone package 1a has enhanced directional function when receiving acoustic waves along two different directions.

Figure 1E:
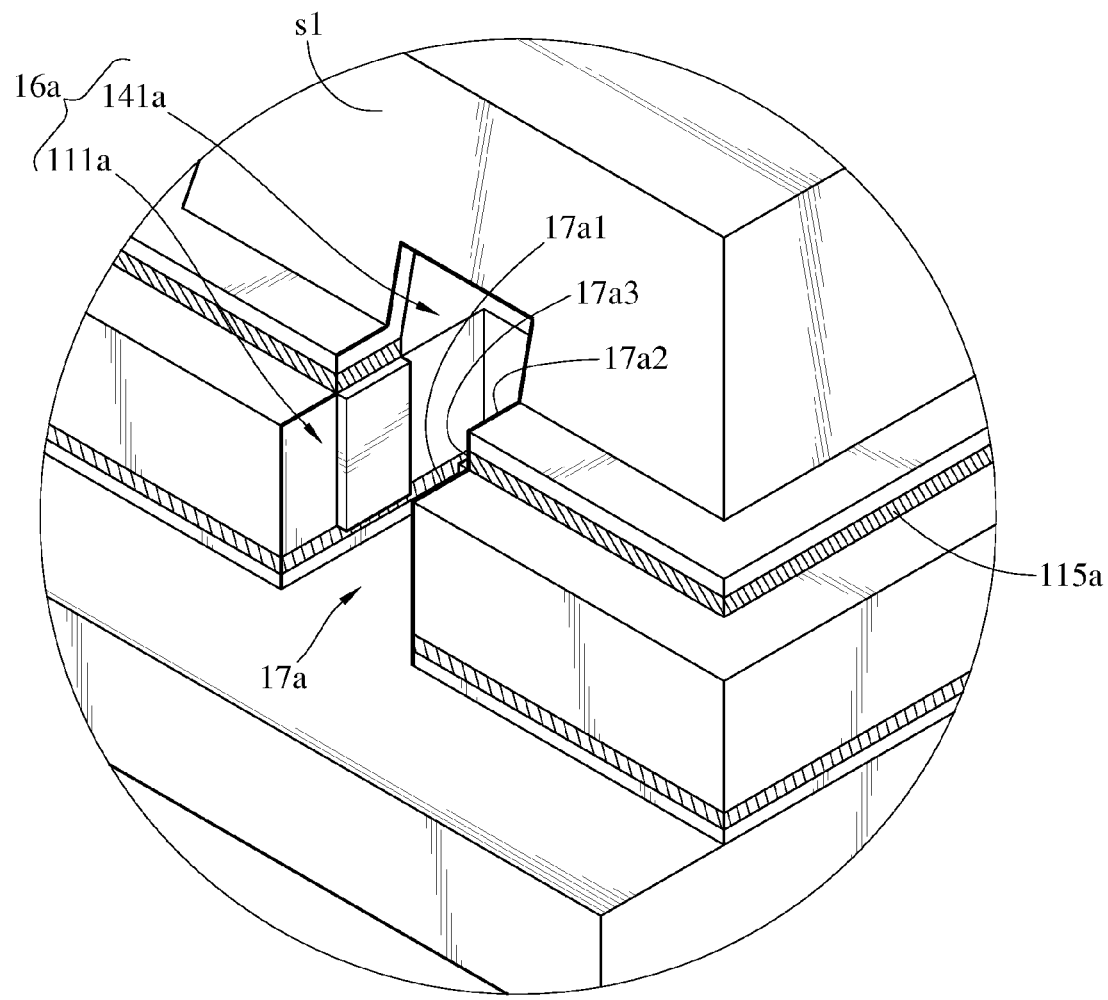
FIG. 1E is an enlarged view of the MEMS microphone package of FIG. 1A.

Moreover, please refer to FIG. 1E, which is an enlarged view of the MEMS microphone package of FIG. 1A. The acoustic hole 16a has an opening 17a on the outer surface s1 of the MEMS microphone package 1a. In detail, the opening 17a of the acoustic hole 16a has a first boundary 17a1 and a second boundary 17a2. The first boundary 17a1 of the opening 17a is the part of the boundary of the first hole 111a. The second boundary 17a2 of the opening 17a is the part of the boundary of the second hole 141a.

Furthermore, the quantity of the MEMS microphone 12 can be adjusted with respect to that of the acoustic hole 16a. In this embodiment, the quantity of the acoustic holes 16a is two, and the quantity of the MEMS microphone 12 can be one or two. When the quantity of the MEMS microphones 12 is two, the MEMS microphones 12 can be disposed in proximity to the acoustic holes 16a, respectively. Thus, the function of sound receiving of the MEMS microphones 12 is enhanced.

The configuration of the electrically conductive cover 14a in FIG. 1A is described as follows with FIG. 2A, which is a schematic perspective view of an electrically conductive cover of FIG. 1A.

Figure 2A:
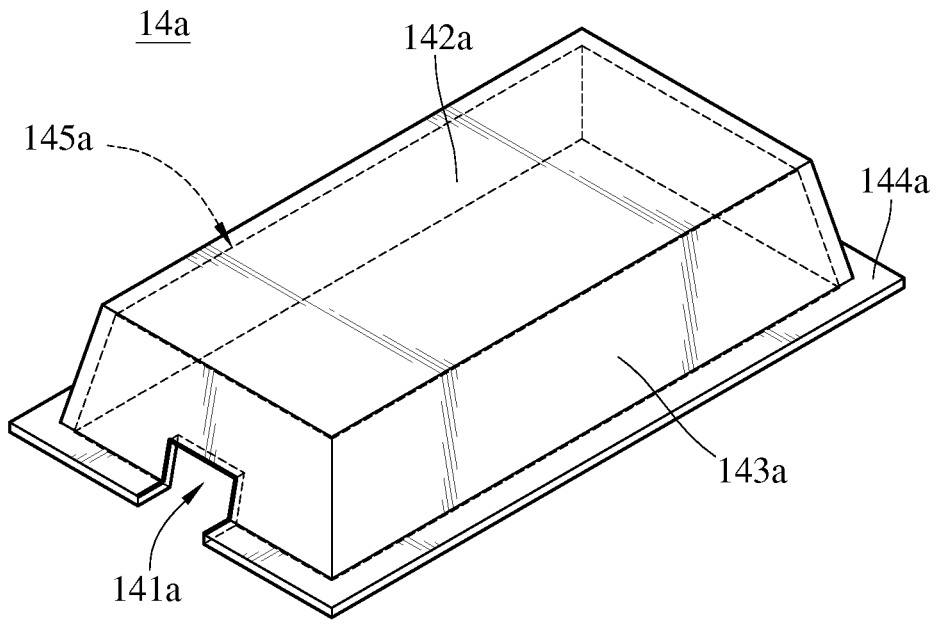
FIG. 2A is a schematic perspective view of an electrically conductive cover of FIG. 1A.

As shown in FIG. 2A, the electrically conductive cover 14a comprises a top portion 142a, a side portion and a brim portion 144a. The side portion 143a surrounds and is connected to the top portion 142a such that the top portion 142a and the side portion 143a forms a space 145a. The brim portion 144a surrounds and is connected to the side portion 143a. The second hole 141a extends from an exterior of the brim portion 144a toward the side portion 143a. In other words, a boundary of the second hole 141a is disposed on the brim portion 144a and the side portion 143a.

Figure 2B:
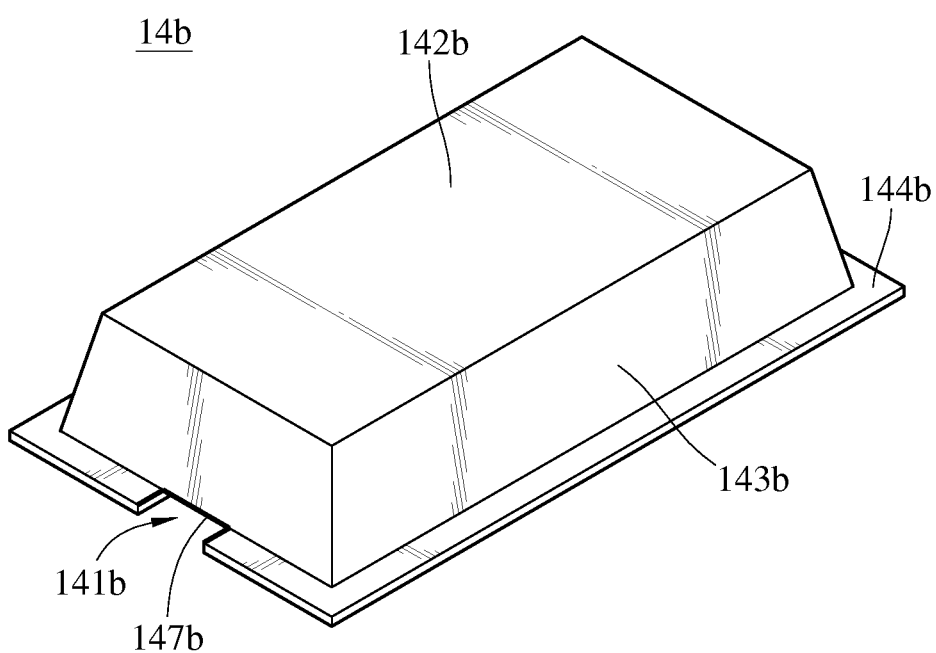
FIG. 2B is a schematic perspective view of an electrically conductive cover according to the second embodiment of the disclosure.
Figure 2C:
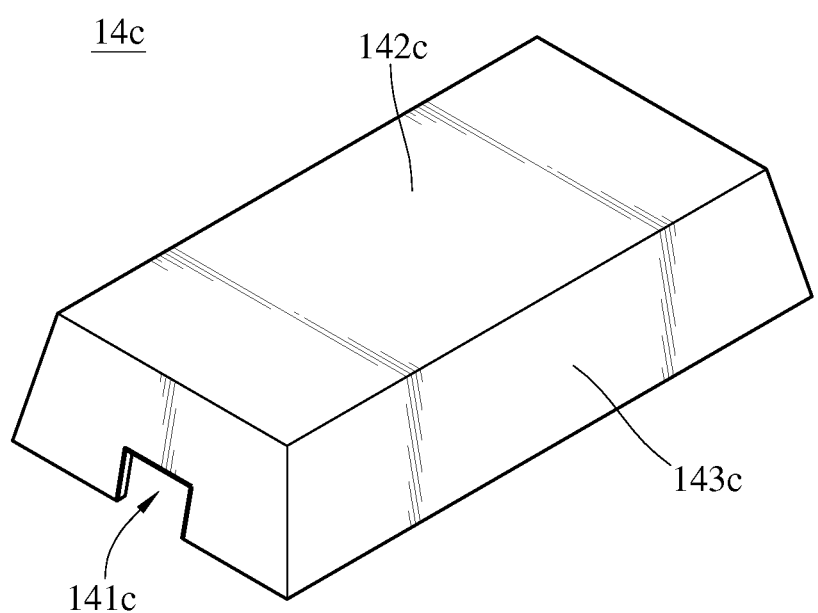
FIG. 2C is a schematic perspective view of an electrically conductive cover according to a third embodiment of the disclosure.

It is noted that the above-mentioned configuration of the electrically conductive cover 14a (i.e., the electrically conductive cover 14a comprising the top portion 142a, the side portion 143a and the brim portion 144a, and the second hole 141a being disposed on the brim portion 144a and the side portion 143a) shown in FIG. 2A is one of the embodiments of the disclosure. Shapes of the electrically conductive covers 14a and locations of the second holes 141a can be adjusted herein without departing from the spirit and the scope of the disclosure. For example, Please refer to FIG. 2B and FIG. 2C, FIG. 2B is a schematic perspective view of an electrically conductive cover according to the second embodiment of the disclosure, and FIG. 2C is a schematic perspective view of an electrically conductive cover according to a third embodiment of the disclosure. The differences between the first through the third embodiments are that: the electrically conductive cover in the first embodiment is shown in FIG. 2A; the electrically conductive cover in the second embodiment is shown in FIG. 2B; the electrically conductive cover in the third embodiment is shown in FIG. 2C.

In the second embodiment, as shown in FIG. 2B, the electrically conductive cover 14b also comprises a top portion 142b, a side portion 143b and a brim portion 144b. The second hole 141b extends from an exterior of the brim portion 144b toward a side edge of the side portion 143b. In other words, the boundary of the second hole 141b is only disposed on the brim portion 144b.

In the third embodiment, as shown in FIG. 2C, the electrically conductive cover 14c does not comprise the brim portion 144b above mentioned in FIG. 2B. That is to say, the electrically conductive cover 14c only comprises a top portion 142c and a side portion 143c. Moreover, the second hole 141c extends inward from an exterior of the side portion 143c and is separated from the top portion 142c by a constant distance. In other words, the boundary of the second hole 141c is only disposed on the side portion 143c.

Figure 3A:
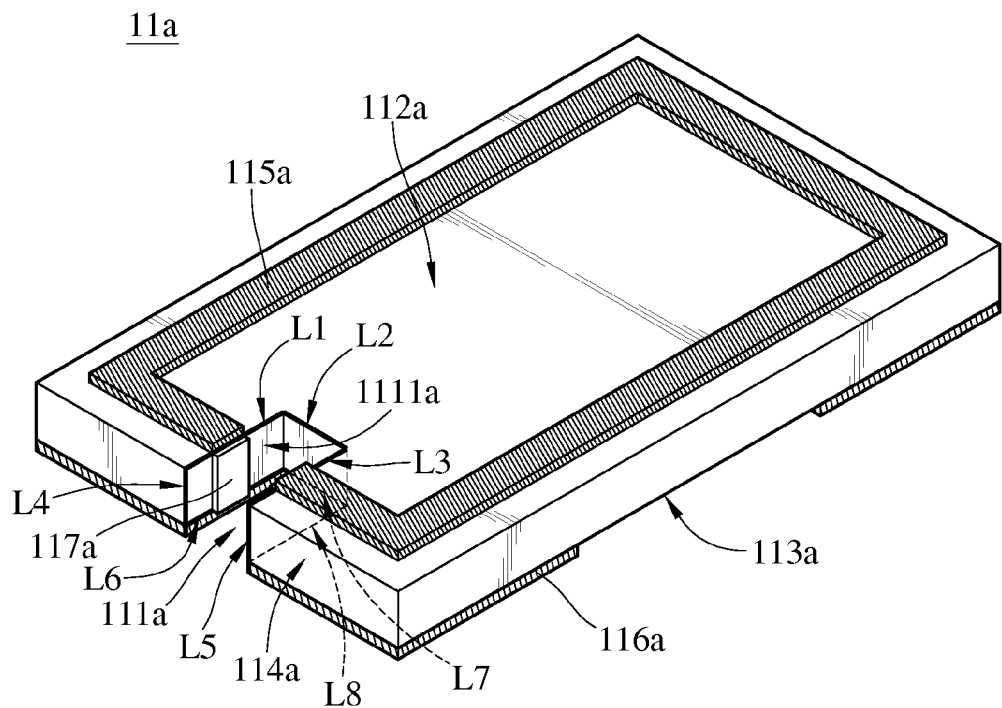
FIG. 3A is a schematic perspective view of a substrate of FIG. 1A.

The configuration of the substrate 11a of FIG. 1A according to the first embodiment is described as follows with FIG. 3A. As shown in FIG. 1A, FIG. 1C, FIG. 1E and FIG. 3A, the substrate 11a further comprises an upper surface 112a, a bottom surface 113a, a side surface 114a, a first electrically conductive layer 115a, a second electrically conductive layer 116a and a third electrically conductive layer 117a. The upper surface 112a and the bottom surface 113a are connected to two sides of the side surface 114a that are opposite to each other. The first hole 111a is formed inward from the side surface 114a of the substrate 11a and extends through the upper surface 112a and the bottom surface 113a of the substrate 11a. In other words, side edges L1-L8 of the surface 1111a of the first hole 111a are connected to the upper surface 112a, the bottom surface 113a and the side surface 114a, respectively (i.e., the side edges L1-L3 are connected to the upper surface 112a, the side edges L4-L5 are connected to the side surface 114a, the side edges L6-L8 are connected to the bottom surface 113a). Hence, the boundary of the first hole 111a are disposed on the upper surface 112a, the bottom surface 113a and the side surface 114a such that the first hole 111a is formed to be a through hole on edge (namely, a peripheral through hole). In this embodiment, the cross-section of the first hole 111a parallel to the upper surface 112a is, but not limited to, rectangular. In other embodiments, for example, the cross-section of the first hole 111a parallel to the upper surface 112a is semicircle or other shapes that extends through the side edges.

The first electrically conductive layer 115a is disposed on the upper surface 112a. The second electrically conductive layer 116a is disposed on the bottom surface 113a. The third electrically conductive layer 117a is disposed on a surface 1111a of the first hole 111a. Also, two sides of the third electrically conductive layer 117a are connected to the first electrically conductive layer 115a and the second electrically conductive layer 116a to form an electrical interconnection. In addition, as shown in FIG. 1E, the opening 17a of the acoustic hole 16a further has a third boundary 17a3. The third boundary 17a3 of the opening 17a is a part of a boundary of the first electrically conductive layer 115a. The third boundary 17a3 is connected to the first boundary 17a1 and the second boundary 17a2.

As shown in FIG. 1A and FIG. 1C, the electrically conductive cover 14a is electrically coupled to the first electrically conductive layer 115a, and the second electrically conductive layer 116a is electrically coupled to one of electrically conductive pads 182 on a printed circuit board 18 outside the MEMS microphone package 1a. The electrically conductive pad 182 is electrically coupled to a fourth electrically conductive layer 181 inside the printed circuit board 18. Since the electrically conductive cover 14a is electrically coupled to the fourth electrically conductive layer 181 in the printed circuit board 18 outside the MEMS microphone package 1a via the first electrically conductive layer 115, the second electrically conductive layer 116a and the third electrically conductive layer 117a, the function of electrical ground can be achieved, which allows the electrically conductive cover 14a being capable of preventing the electromagnetic interference.

In this embodiment, the fourth electrically conductive layer 181, which is used for electrical grounding, is separated from the substrate 11a, i.e., a separation design. That is, in this embodiment, the substrate 11a does not comprise the fourth electrically conductive layer 181 therein. In other words, the substrate 11a only comprises two electrically conducting layers disposed on the upper surface 112a and the bottom surface 113a of the substrate 11a, respectively, which further reduces material cost and fabrication cost of the substrate 11a.

Moreover, as shown in FIG. 1A and FIG. 3A, since the first hole 111a comprises the third electrically conductive layer 117a on its surface 1111a, the first hole 111a not only is capable of receiving sounds but also has a function of electrical via. Thus, the quantity of the via on the substrate 11a can be reduced to one such that the total area of the substrate 11a is further reduced.

In addition, since the acoustic hole 16a of the MEMS microphone package 1a in this embodiment is formed by both the first hole 111a of the substrate 11a and the second hole 141a of the electrically conductive cover 14a, the MEMS microphone package 1a is not only having better quality of sound receiving but also having thinner package profile. Traditionally, when the acoustic hole 16a is only disposed on the substrate 11a with thinner package profile, the dimension of the acoustic hole 16a is reduced according to the thinner substrate. The smaller dimension of the acoustic hole 16a decreases the quality of sound receiving of the MEMS microphone 12. Accordingly, when the thickness of the MEMS microphone package 1a is reduced and the acoustic hole 16a is only disposed on the substrate 11a, the quality of sound receiving of the MEMS microphone 12 has to be sacrificed. However, in embodiments of this disclosure, the acoustic hole 16a is formed by both the first hole 111a of the substrate 11a and the second hole 141a of the electrically conductive cover 14a. Thus, when the thickness of the MEMS microphone package 1a is designed to be reduced, the dimension of the acoustic hole 16a is originally maintained rather than being reduced according to the thinned substrate 11a. In short, the MEMS microphone package 1a not only maintains the quality of sound receiving but also has the thinner profile of package.

Figure 3B:
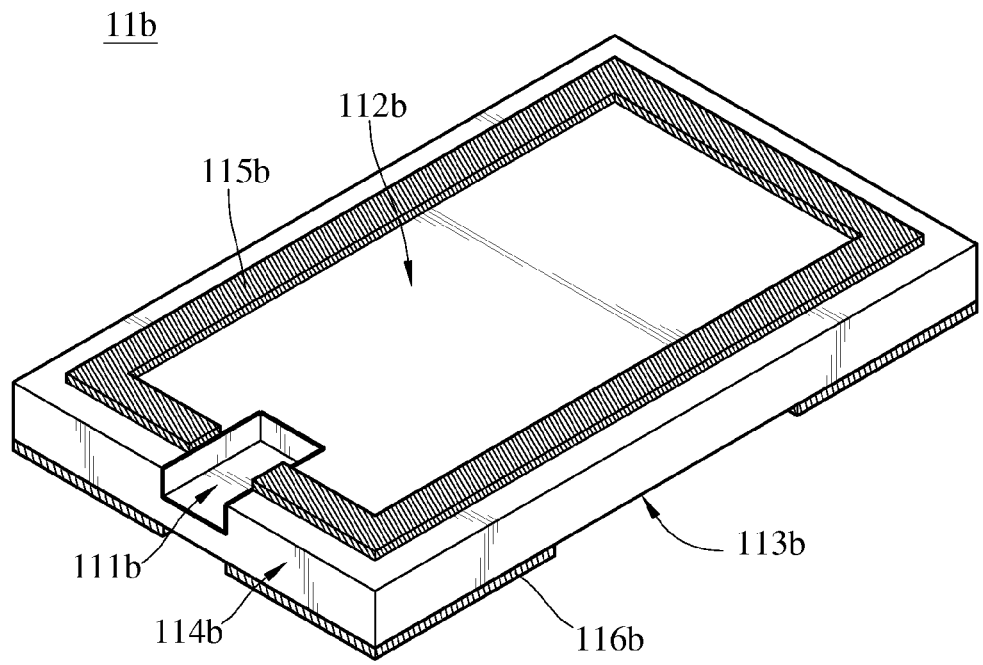
FIG. 3B is a schematic perspective view of a substrate according to a fourth embodiment of the disclosure.
Figure 3C:
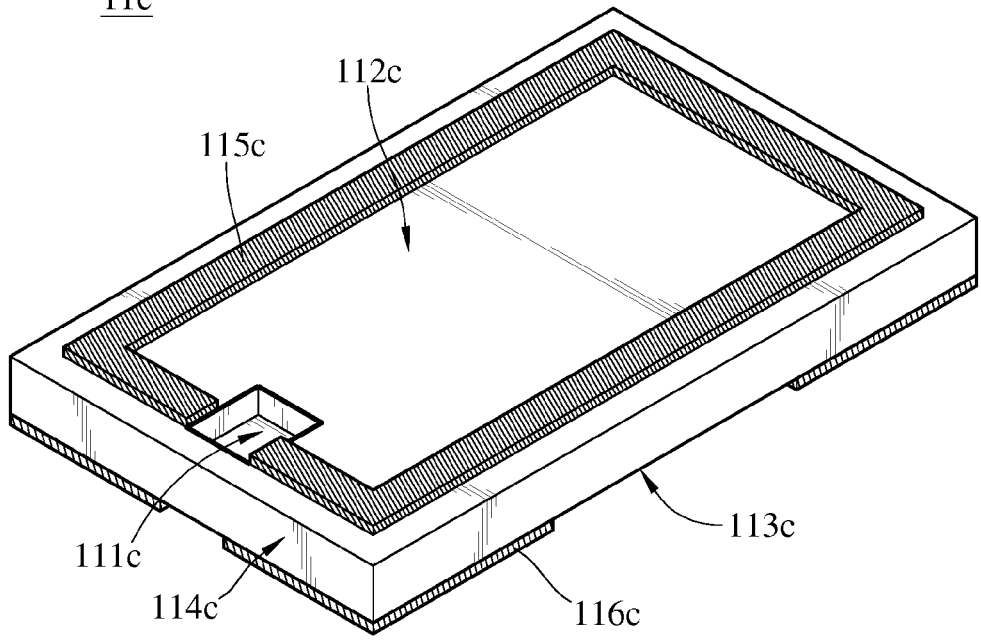
FIG. 3C is a schematic perspective view of a substrate according to a fifth embodiment of the disclosure.
Figure 3D:
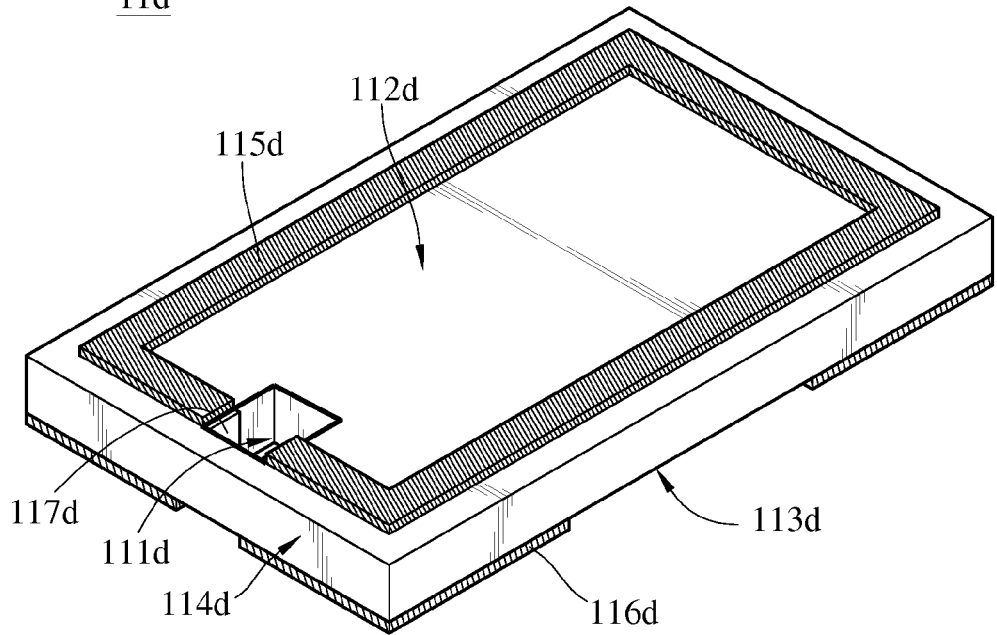
FIG. 3D is a schematic perspective view of a substrate according to a sixth embodiment of the disclosure.

It is noted that the first hole 111a of the substrate 11a shown in FIG. 3A forms a through hole on edge, but it is only one of the embodiments of the disclosure. Types of the first hole 111a can be adjusted herein without departing from the spirit and the scope of the disclosure. For example, referring to FIG. 3B through FIG. 3D, FIG. 3B is a schematic perspective view of a substrate according to a fourth embodiment of the disclosure, FIG. 3C is a schematic perspective view of a substrate according to a fifth embodiment of the disclosure, and FIG. 3D is a schematic perspective view of a substrate according to a sixth embodiment of the disclosure. The differences between the first embodiments and the other embodiments mentioned above are described as follows.

The difference between the fourth embodiment (as shown in FIG. 3B) and the first embodiment (as shown in FIG. 3A) is that: the first hole 111b of the substrate 11b in the fourth embodiment is also formed (i.e., recessed) toward the side surface 114b of the substrate 11b, but the first hole 111b only extends through the upper surface 112b of the substrate 11b without extending through the bottom surface 113b of the substrate 11b. Thus, the first hole 111b forms a peripheral blind hole. In this embodiment, the cross-section of the first hole 111b parallel to the upper surface 112a is, but not limited to, rectangular. In other embodiments, for example, the cross-section of the first hole 111b parallel to the upper surface 112a is semicircle or other shapes. It is noted that the peripheral blind hole can also be formed by attaching a thin film to the bottom of the through hole to form the peripheral blind hole.

Moreover, in this embodiment, the first hole 111b forms a peripheral blind hole, and this blind hole only extends through the upper surface 112b of the substrate 11b without extending through the bottom surface 113b of the substrate 11b. In this embodiment, the first electrically conductive layer 115b and the second electrically conductive layer 116b are disposed on the upper surface 112b and the bottom surface 113b, respectively, and the first electrically conductive layer 115b can be electrically coupled to the second electrically conductive layer 116b via an electrical via (not shown) on the substrate.

The difference between the fifth embodiment (as shown in FIG. 3C) and the first embodiment (as shown in FIG. 3A) is that: in the fifth embodiment, the first hole 111c of the substrate 11c is not in contact with the side surface 114c and the bottom surface 113c of the substrate 11c, and the first hole 111c only extends through the upper surface 112c of the substrate 11c. That is to say, the boundary of the first hole 111c is only disposed on the upper surface 112c of the substrate 11c, and therefore the first hole 111c forms a blind hole.

It is noted that, the first hole 111c forms a blind hole that only extends through the upper surface 112c of the substrate 11c. In this embodiment, the first electrically conductive layer 115c and the second electrically conductive layer 116c are disposed on the upper surface 112c and the bottom surface 113c, respectively. The first electrically conductive layer 115c and the second electrically conductive layer 116c can be electrically coupled to each other via an electrical via (not shown) on the substrate.

The difference between the sixth embodiment (as shown in FIG. 3D) and the first embodiment (as shown in FIG. 3A) is that: in the sixth embodiment, the first hole 111d of the substrate 11d extends through both the upper surface 112d and the bottom surface 113d of the substrate 11d, but the first hole 111d is not in contact with the side surface 114d of the substrate 11d. That is to say, the boundary of the first hole 111d is disposed on both the upper surface 112d and the bottom surface 113d of the substrate 11d, and therefore the first hole 111d forms a through hole that extends through the upper surface 112d and the bottom surface 113d of the substrate 11d. The substrate 11d in this embodiment is similar to the substrate 11a shown in FIG. 3A, the first electrically conductive layer 115d, the second electrically conductive layer 116d and the third electrically conductive layer 117d are disposed on the upper surface 112d, the bottom surface 113d and the surface of the first hole 111d, respectively. It is noted that a thin film (not shown) can be attached to the bottom of the first hole 111d (as shown in FIG. 3D) to form the blind hole together.

According to the above-mentioned description, the electrically conductive covers 14a-14c have three different kinds of embodiments shown in FIG. 2A through FIG. 2C, and the substrates 11a-11d have four different embodiments shown in FIG. 3A through FIG. 3D. Accordingly, the MEMS microphone package in this disclosure can combine one kind of the electrically conductive covers 14a-14c among FIG. 2A through FIG. 2C with one kind of the substrate 11a-11d shown in FIG. 3A through FIG. 3D. Consequently, the MEMS microphone package of the disclosure has at least twelve different kinds of embodiments.

Figure 4A:
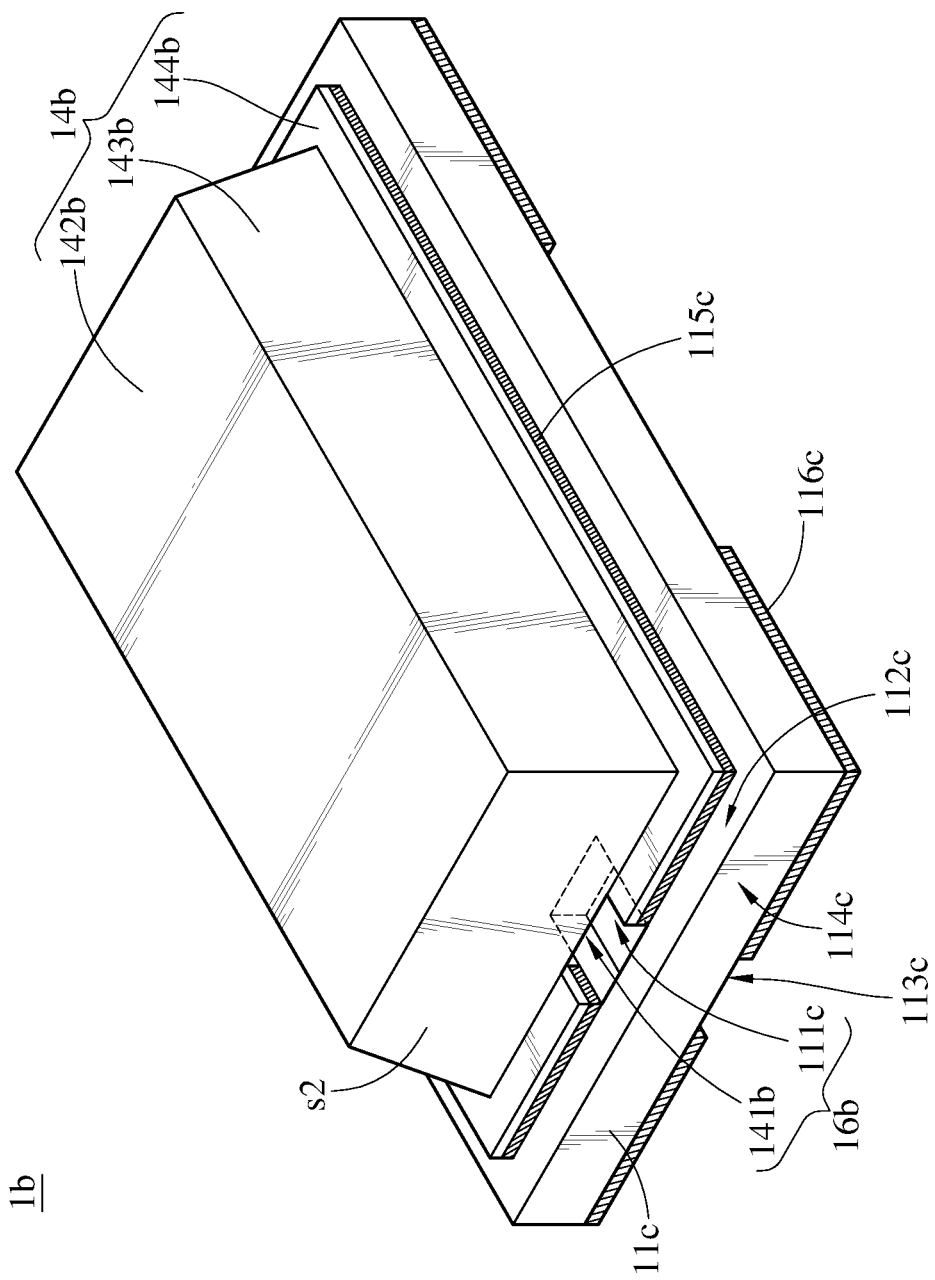
FIG. 4A is a schematic perspective view of an MEMS microphone package according to a seventh embodiment of the disclosure.
Figure 4B:
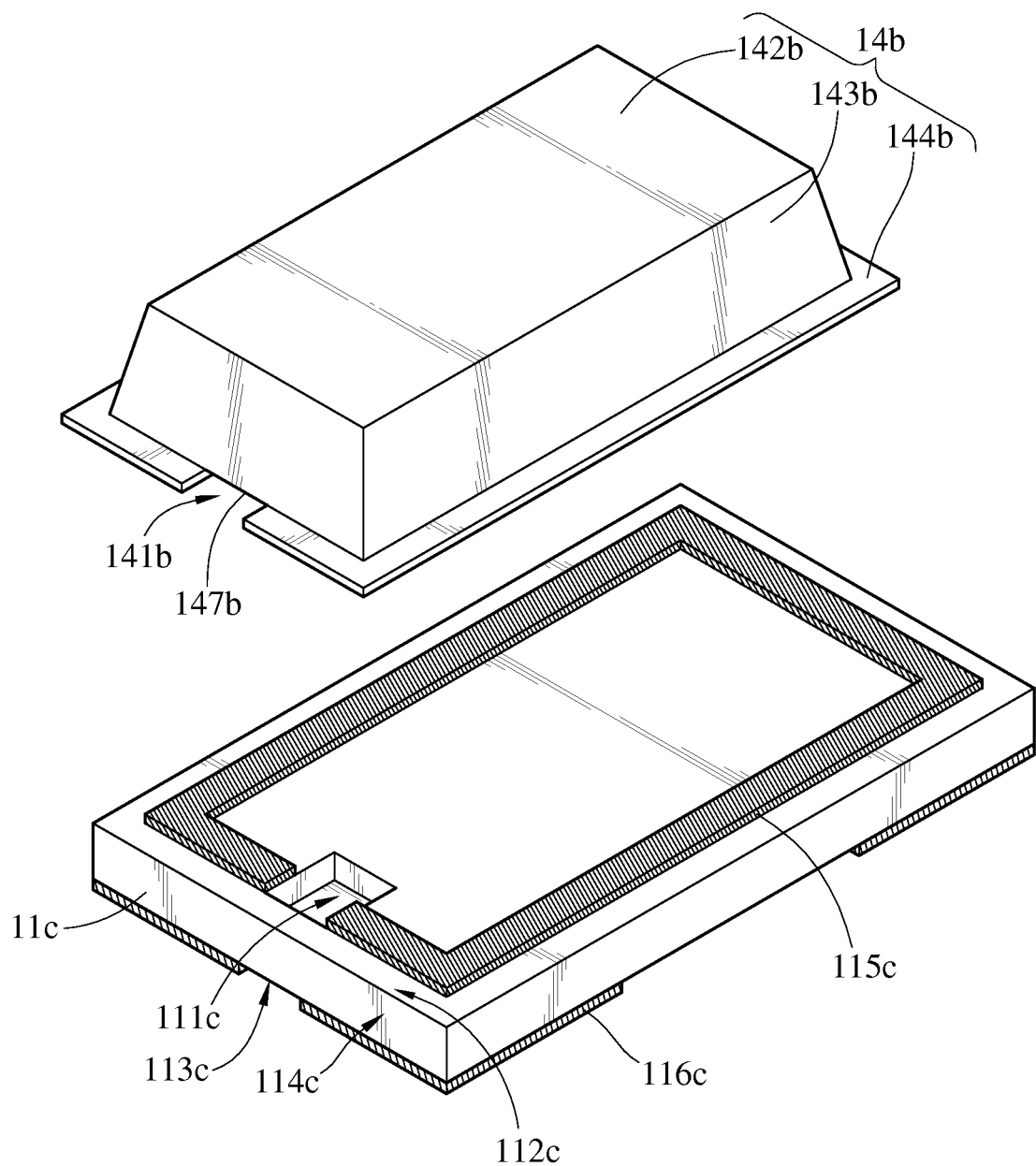
FIG. 4B is an exploded view of FIG. 4A.
Figure 4C:
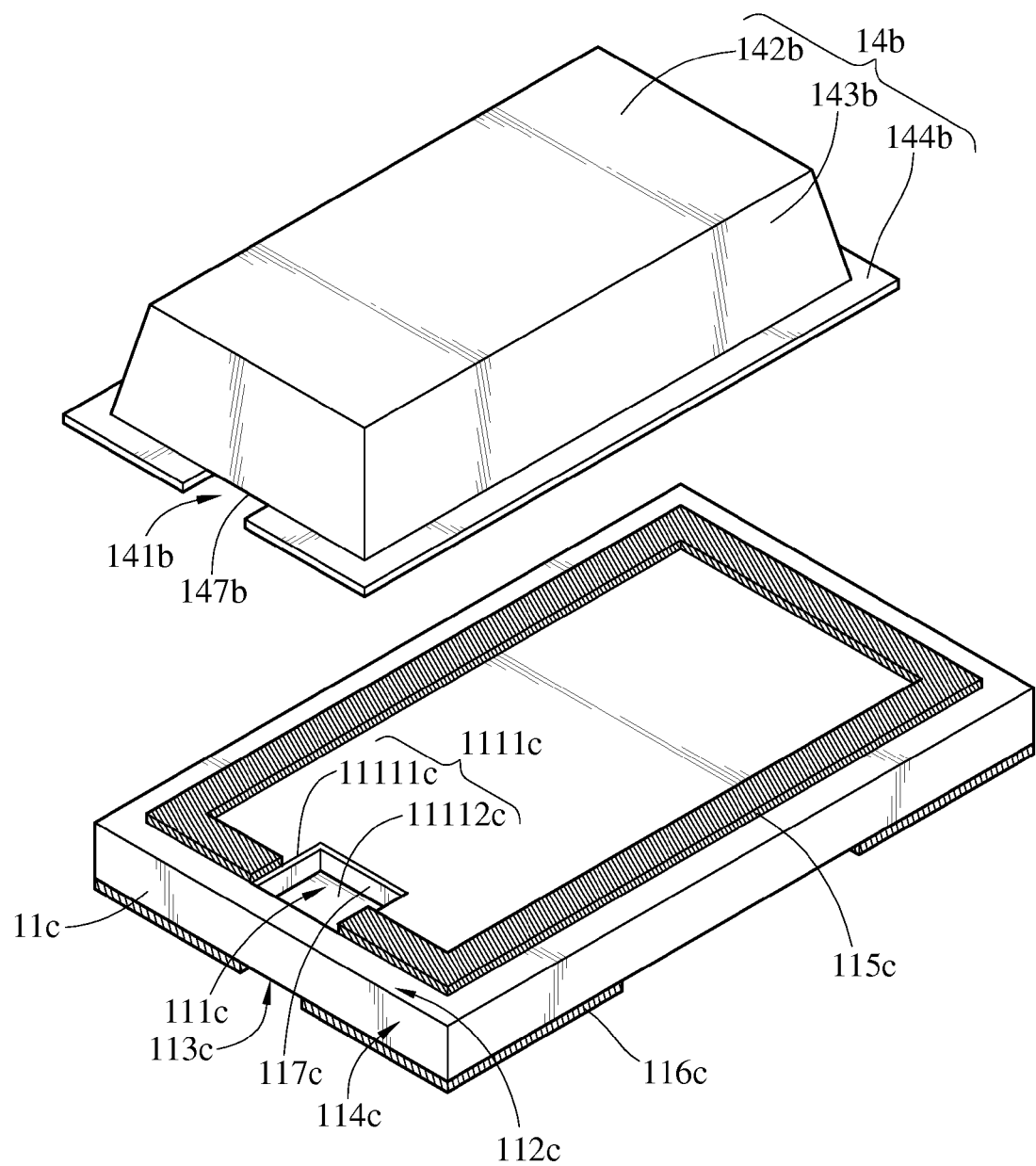
FIG. 4C is an exploded view of an MEMS microphone package according to an eighth embodiment of the disclosure.
Figure 5:
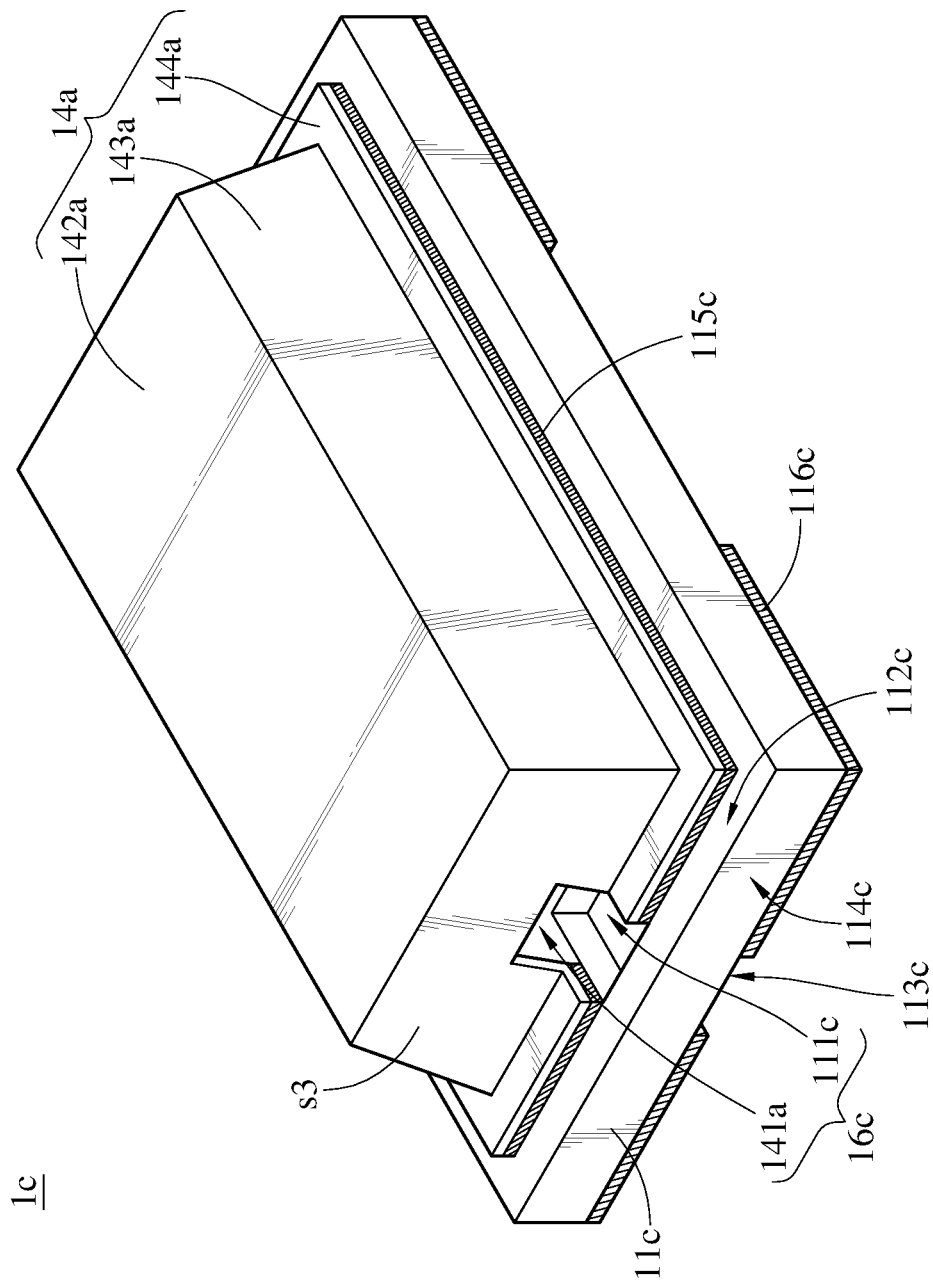
FIG. 5 is a schematic perspective view of an MEMS microphone package according to a ninth embodiment of the disclosure.
Figure 6:
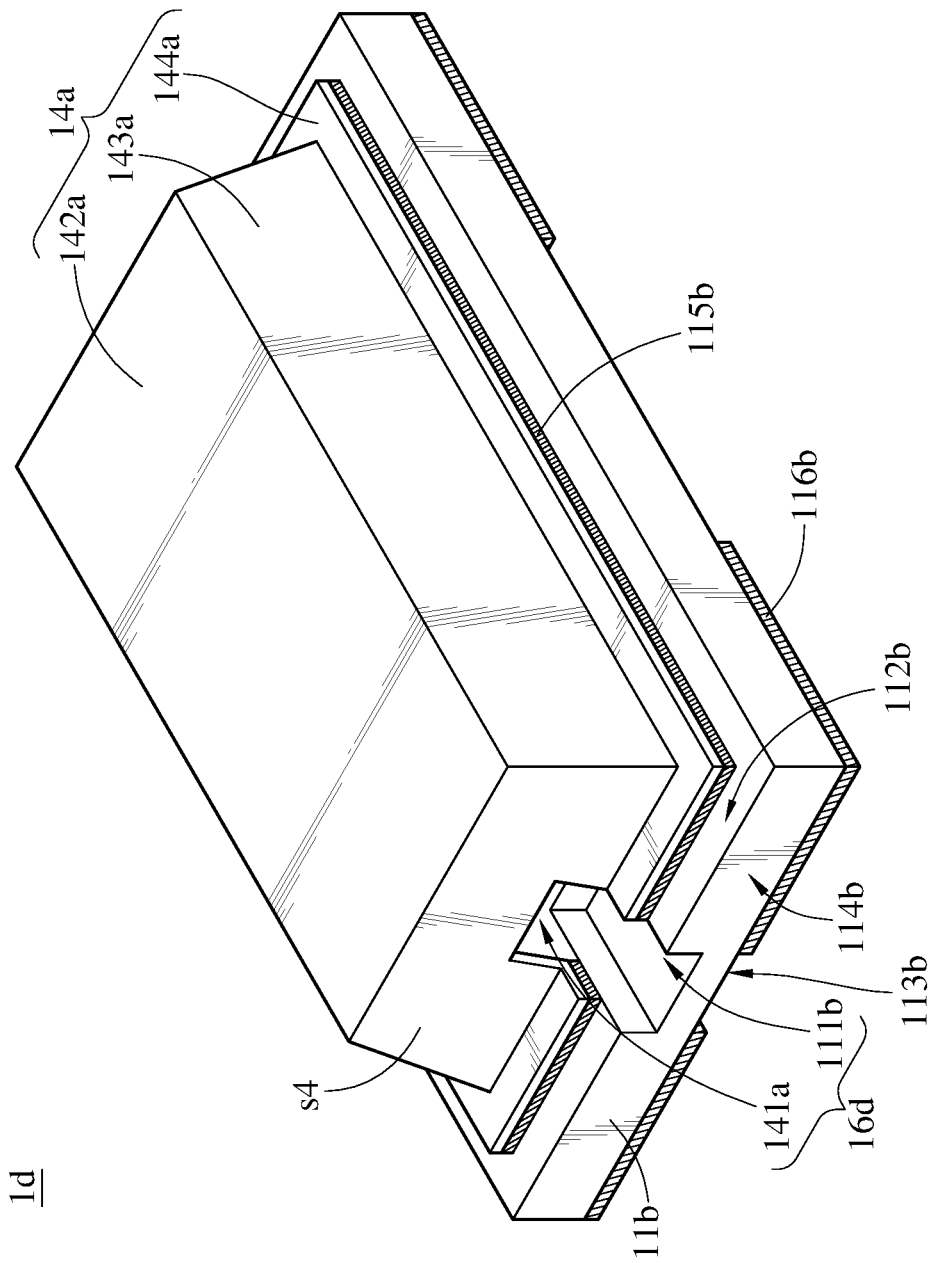
FIG. 6 is a schematic perspective view of an MEMS microphone package according to a tenth embodiment of the disclosure.

The following introduces four of the foregoing twelve embodiments. Please refer to FIG. 4A through FIG. 7. A schematic perspective view of an MEMS microphone package according to a seventh embodiment of the disclosure is shown in FIG. 4A and an exploded view of the MEMS microphone package in FIG. 4A is shown in FIG. 4B. An exploded view of an MEMS microphone package according to an eighth embodiment of the disclosure is shown in FIG. 4C. In FIG. 5, a schematic perspective view of an MEMS microphone package according to a ninth embodiment of the disclosure is shown. In FIG. 6 a schematic perspective view of an MEMS microphone package according to a tenth embodiment of the disclosure is shown, and in FIG. 7, a schematic perspective view of an MEMS microphone package according to an eleventh embodiment of the disclosure is shown.

As shown in FIG. 4A and FIG. 4B, the MEMS microphone package 1b in the seventh embodiment is selected from the electrically conductive cover 14b shown in FIG. 2B and the substrate 11c shown in FIG. 3C. In this embodiment, the acoustic hole 16b of the MEMS microphone package 1b is formed by the second hole 141b disposed on the brim portion 144b and the first hole 111c which is a blind hole. In addition, the MEMS microphone package 1b has an outer surface s2.

The MEMS microphone package 1b in this embodiment comprises a substrate 11c and an electrically conductive cover 14b. An MEMS microphone (not shown) and at least one IC chip (not shown) are disposed between the substrate 11c and the electrically conductive cover 14b, which is similar to the embodiment shown in FIG. 1.

The substrate 11c comprises at least one first hole 111c. The first hole 111c of the substrate 11c is not in contact with the side surface 114c and the bottom surface 113c of the substrate 11c, and the first hole 111c only extends through the upper surface 112c of the substrate 11c. In other words, the boundary of the first hole 111c is only disposed on the upper surface 112c of the substrate 11c, such that the first hole 111c forms a blind hole.

The electrically conductive cover 14b comprises a top portion 142b, a side portion 143b, a brim portion 144b and a second hole 141b. The second hole 141b extends inward from an exterior of the brim portion 144b towards a side edge 147b of the side portion 143b. In other words, the boundary of the second hole 141b in this embodiment is only disposed on the brim portion 144b. The electrically conductive cover 14b is bonded to the substrate 11c to form a chamber 15b for accommodating the MEMS microphone (not shown) and the IC chip (not shown). Also, the first hole 111c and the second hole 141b form an acoustic hole 16b. The acoustic hole 16b communicates with the chamber 15 such that the MEMS microphone within the chamber 15b is capable of receiving acoustic waves outside the MEMS microphone package 1b. In addition, the quantity of the acoustic hole 16b in this embodiment is one, and the acoustic hole 16b is located at one side of the MEMS microphone package 1b to enhance the directional function.

As shown in FIG. 4C, the MEMS microphone package 1b in the eighth embodiment of the disclosure is selected form the electrically conductive cover 14b shown in FIG. 2B and the substrate 11c shown in FIG. 3C, which is the same as the MEMS microphone package 1b of the seventh embodiment shown in FIG. 4B. The difference between the seventh and eighth embodiments is that the MEMS microphone package 1b in the eighth embodiment shown in FIG. 4C further comprises a third electrically conductive layer 117c. The third electrically conductive layer 117c is disposed on the surface 1111c of the first hole 111c. The surface 1111c of the first hole 111c comprises a side surface 11111c and a bottom surface 11112c. The third electrically conductive layer 117c can be electrically coupled to the electrically conductive cover 14b through the first electrically conductive layer 115c, and the third electrically conductive layer 117c is electrically coupled to an electrical ground layer. For example, the electrical ground layer is the fourth electrically conductive layer 181 shown in FIG. 1C or an electrical conductive layer (not shown) inside the substrate 11c. Thus, the electrically conductive cover 14b and the third electrically conductive layer 117c form a shield together to prevent the electromagnetic interference. In other embodiments (not shown), the third electrically conductive layer 117c is disposed on all of the side surface 11111c and the bottom surface 11112c of the first hole 111c such that the electrically conductive cover 14b and the third electrically conductive layer 117c form a shield together so as to prevent the MEMS microphone 12 and the IC chip 13 of the MEMS microphone package 1b from the electromagnetic interference. Specifically, the third electrically conductive layer 117c in this embodiment enhances the whole protection of the MEMS microphone package 1b against the electromagnetic interference.

As shown in FIG. 5, the MEMS microphone package 1c in the ninth embodiment is selected from the electrically conductive cover 14a shown in FIG. 2A and the substrate 11c shown in FIG. 3C. In this embodiment, the acoustic hole 16c of the MEMS microphone package 1c is formed by the second hole 141a and the first hole 111c. In addition, the MEMS microphone package 1c has an outer surface s3. In this embodiment, it is noted that the boundary of second hole 141a is disposed on both the side portion 143a and the brim portion 144a and the first hole 11c is a blind hole. In this embodiment, one part of the boundary of the at least one first hole 11c is not coplanar with one part of the boundary of the at least one second hole 141a. Specifically, the part of the boundary of the at least one first hole 111c and the part of the boundary of the at least one second hole 141a are formed on different planes of different objects (a plane of the electrically conductive cover 14a and a plane of the substrate 11a), respectively. Also, the plane of the electrically conductive cover 14a on which the second hole 141a is disposed and the plane of the substrate 11a on which the first hole 111c is disposed are not parallel to each other.

Figure 7:
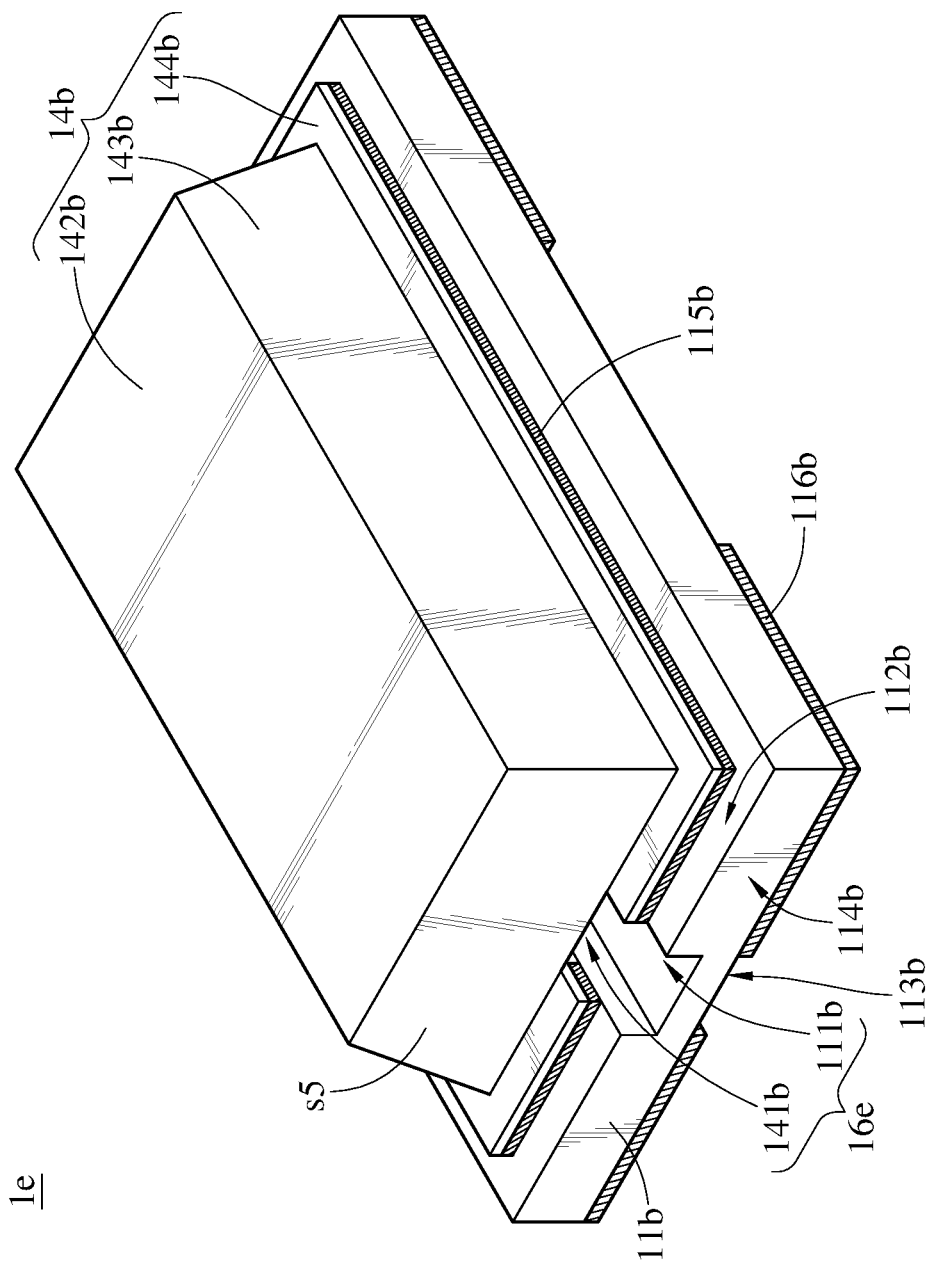
FIG. 7 is a schematic perspective view of an MEMS microphone package according to an eleventh embodiment of the disclosure.

As shown in FIG. 6, the MEMS microphone package 1d in the tenth embodiment is selected from the electrically conductive cover 14a shown in FIG. 2A and the substrate 11b shown in FIG. 3B. In this embodiment, the acoustic hole 16d of the MEMS microphone package 1d is formed by the second hole 141a and the first hole 111b. In addition, the MEMS microphone package 1d has an outer surface s4. In this embodiment, the boundary of second hole 141a is disposed on both the side portion 143a and the brim portion. 144a and the first hole 111b is a peripheral blind hole. In this embodiment, one part of the boundary of the at least one first hole 111b is not coplanar with one part of the boundary of the at least one second hole 141a. Specifically, the part of the boundary of the at least one first hole 111b and the part of the boundary of the at least one second hole 141a are formed on a plane of the electrically conductive cover 14a and a plane of the substrate 11b, respectively. In detail, the part of the boundary of the at least one first hole 111b and the part of the boundary of the at least one second hole 141a are formed on different surfaces of different objects, respectively As shown in FIG. 7, the MEMS microphone package 1e of the eleventh embodiment is selected from the electrically conductive cover 14b shown in FIG. 2B and the substrate 11b shown in FIG. 3B. In this embodiment, the acoustic hole 16e of the MEMS microphone package 1e is formed by the second hole 141b and the first hole 111b. In addition, the MEMS microphone package 1e has an outer surface s5. In this embodiment, the boundary of the second hole 141b is disposed only on the brim portion 144b and the first hole 111b is a peripheral blind hole. In this embodiment, one part of the boundary of the at least one first hole 111b is not coplanar with one part of the boundary of the at least one second hole 141b. Specifically, the part of the boundary of the at least one first hole 111b and the part of the boundary of the at least one second hole 141b are formed on a plane of the electrically conductive cover 14b and a plane of the substrate 11b, respectively. In detail, the part of the boundary of the at least one first hole 111b and the part of the boundary of the at least one second hole 141b are formed on different surfaces of different objects, respectively.

Figure 8:
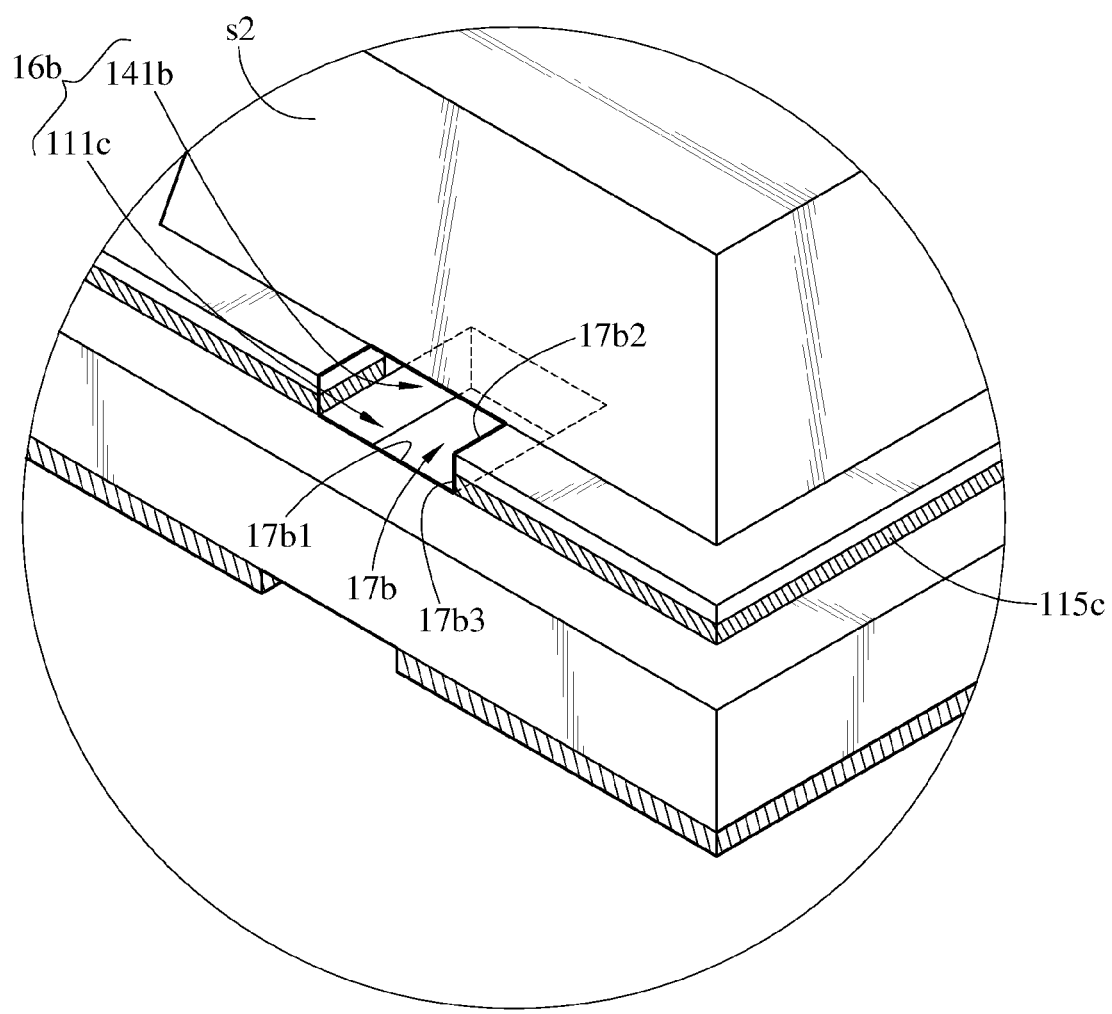
FIG. 8 is an enlarged view of the MEMS microphone package of FIG. 4A.
Figure 9:
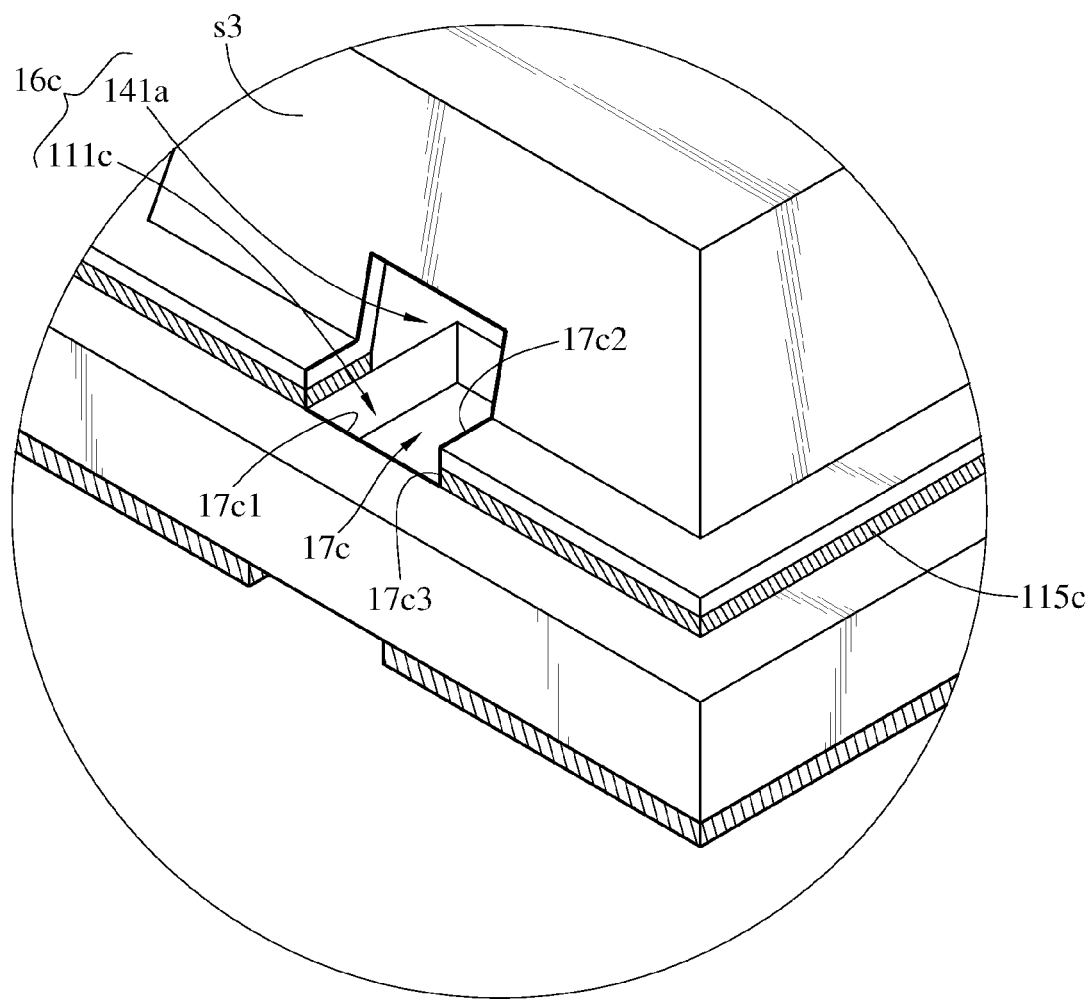
FIG. 9 is an enlarged view of the MEMS microphone package of FIG. 5.
Figure 10:
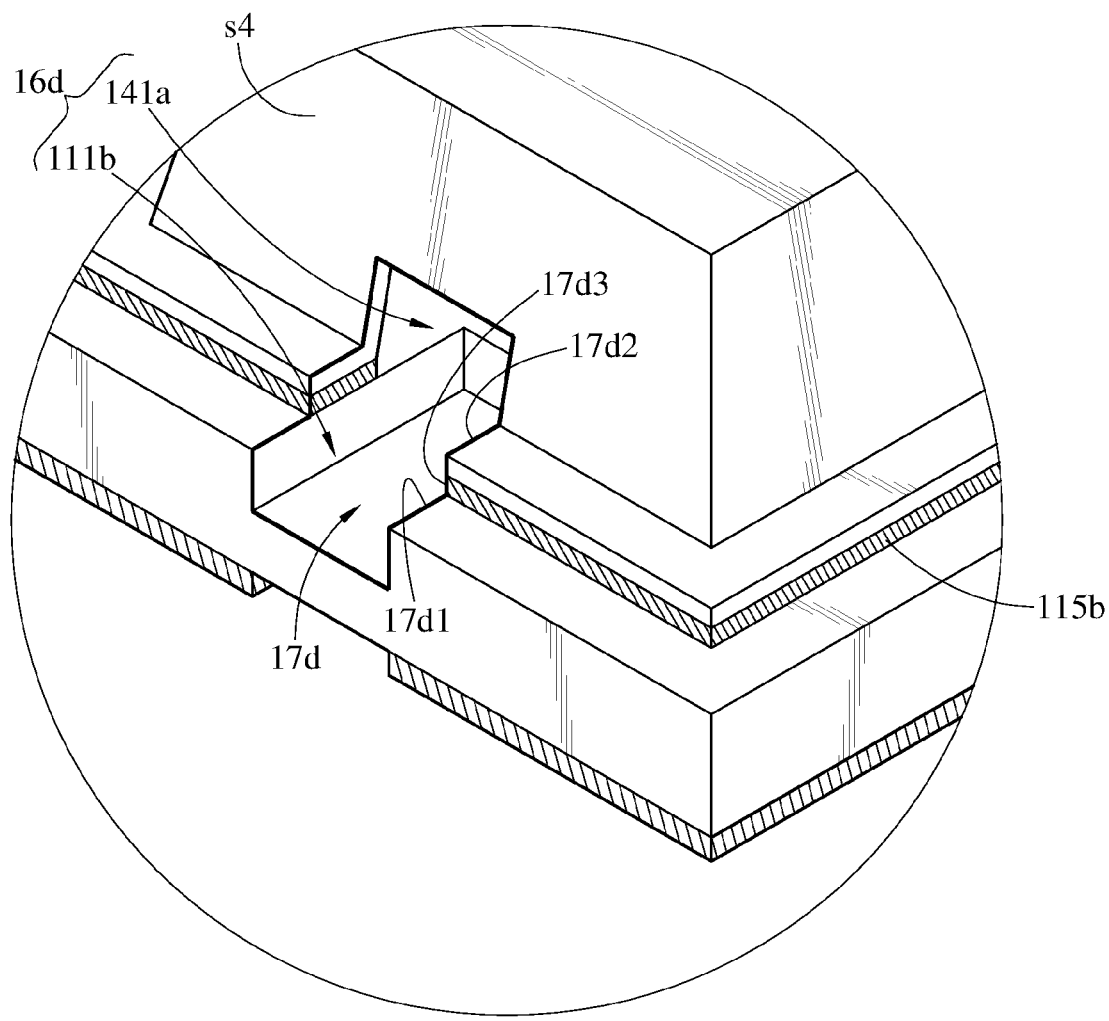
FIG. 10 is an enlarged view of the MEMS microphone package of FIG. 6.
Figure 11:
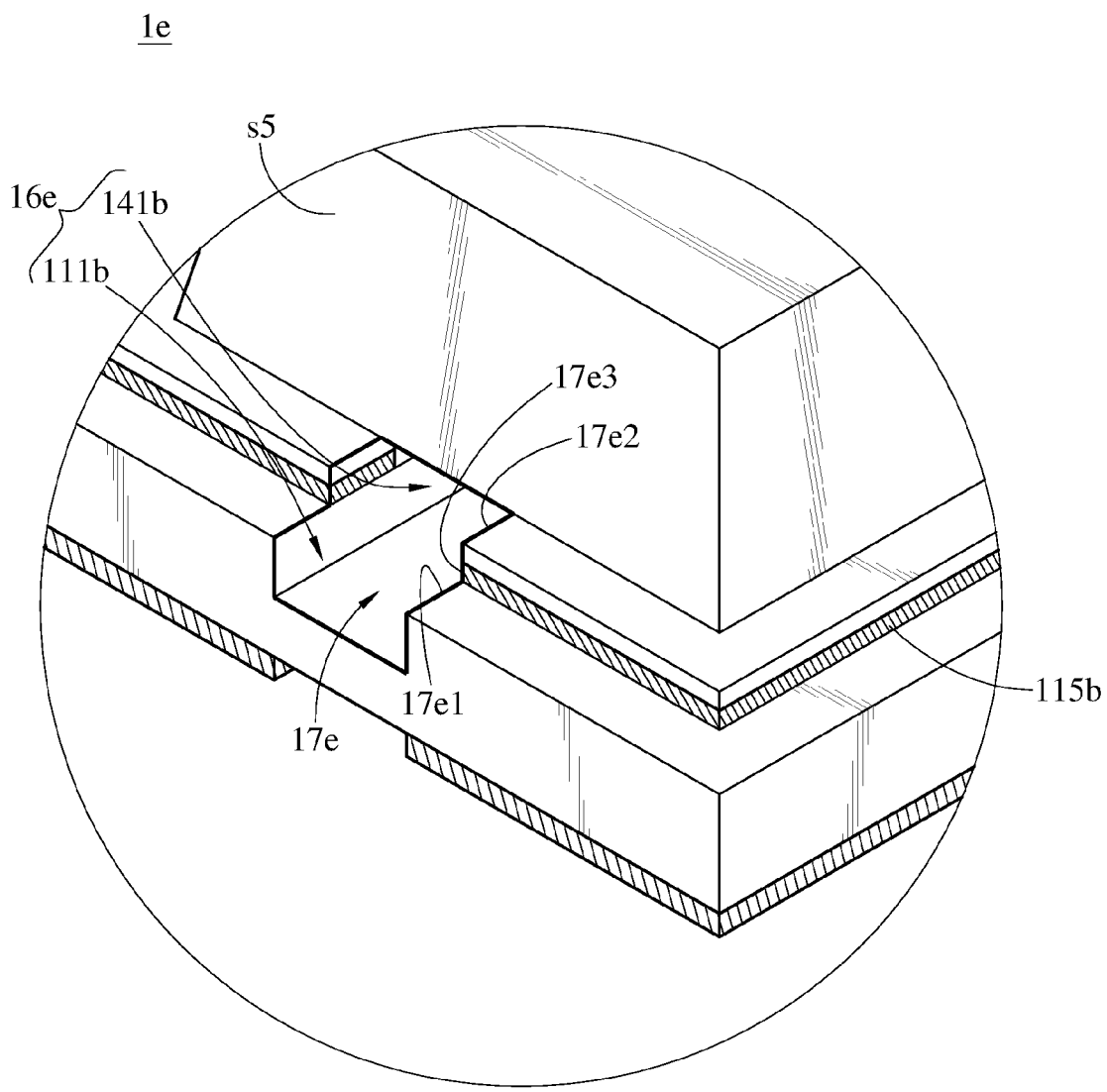
FIG. 11 is an enlarged view of the MEMS microphone package of FIG. 7.

In addition, please refer to FIGS. 8-11, FIG. 8 is an enlarged view of the MEMS microphone package of FIG. 4A, FIG. 9 is an enlarged view of the MEMS microphone package of FIG. 5, FIG. 10 is an enlarged view of the MEMS microphone package of FIG. 6 and FIG. 11 is an enlarged view of the MEMS microphone package of FIG. 7.

As shown in FIG. 8, the acoustic hole 16b has an opening 17b on the outer surface s2 of the MEMS microphone package 1b. In detail, the opening 17b of the acoustic hole 16b has a first boundary 17b1, a second boundary 17b2 and a third boundary 17b3. The first boundary 17b1 of the opening 17b is the part of the boundary of the first hole 111c. The second boundary 17b2 of the opening 17b is the part of the boundary of the second hole 141c. The third boundary 17b3 of the opening 17b is a part of a boundary of the first electrically conductive layer 115c. The third boundary 17b3 is connected to the first boundary 17b1 and the second boundary 17b2.

As shown in FIG. 9, the acoustic hole 16c has an opening 17c on the outer surface s3 of the MEMS microphone package 1c. In detail, the opening 17c of the acoustic hole 16c has a first boundary 17c1, a second boundary 17c2 and a third boundary 17c3. The first boundary 17c1 of the opening 17c is the part of the boundary of the first hole 111c. The second boundary 17c2 of the opening 17c is the part of the boundary of the second hole 141b. The third boundary 17c3 of the opening 17c is a part of a boundary of the first electrically conductive layer 115c. The third boundary 17c3 is connected to the first boundary 17c1 and the second boundary 17c2.

As shown in FIG. 10, the acoustic hole 16d has an opening 17d on the outer surface s4 of the MEMS microphone package 1d. In detail, the opening 17d of the acoustic hole 16d has a first boundary 17d1, a second boundary 17d2 and a third boundary 17d3. The first boundary 17d1 of the opening 17d is the part of the boundary of the first hole 111b. The second boundary 17d2 of the opening 17d is the part of the boundary of the second hole 141a. The third boundary 17d3 of the opening 17d is a part of a boundary of the first electrically conductive layer 115b. The third boundary 17d3 is connected to the first boundary 17d1 and the second boundary 17d2.

As shown in FIG. 11, the acoustic hole 16e has an opening 17e on the outer surface s5 of the MEMS microphone package 1e. In detail, the opening 17e of the acoustic hole 16e has a first boundary 17e1, a second boundary 17e2 and a third boundary 17e3. The first boundary 17e1 of the opening 17e is the part of the boundary of the first hole 111b. The second boundary 17e2 of the opening 17e is the part of the boundary of the second hole 141b. The third boundary 17e3 of the opening 17e is a part of a boundary of the first electrically conductive layer 115b. The third boundary 17e3 is connected to the first boundary 17e1 and the second boundary 17e2.

In the current technology, acoustic holes of MEMS microphone packages are disposed on the substrate or the cover. In other words, in the current technology, the boundaries of the acoustic holes of the MEMS microphone package are on the same plane. When the MEMS microphone package is assembled in a portable electronic device (not shown), such as cellular phones or tablet computers, the acoustic hole of the MEMS microphone package needs to face a sound inlet disposed on a surface of a casing of the portable electronic device so as to enhance its quality of sound receiving. Moreover, in the current technology, when the acoustic hole of the MEMS microphone package needs to face another sound inlet disposed on another surface of the casing of the portable electronic device, the position of the MEMS microphone package in the portable electronic device needs to be changed. Thus, it is harder for the current MEMS microphone package to face different sound inlets disposed on different surfaces of a casing of the portable electronic device without changing the position of the MEMS microphone package, which means it diminishes the flexibility of the MEMS microphone package assembly.

However, in the MEMS microphone package according to the embodiments of the disclosure (as shown in FIG. 1A and FIG. 5 through FIG. 7), when the boundary of the first hole of the substrate is disposed on the upper surface of the substrate (as shown in FIG. 3A through FIG. 3D) and the boundary of the second hole of the electrically conductive cover are disposed on the different planes, the MEMS microphone package (as shown in FIG. 1A and FIG. 5 through FIG. 7) has more flexibility of the MEMS microphone package assembly. Specifically, when the MEMS microphone package (as shown in FIG. 1A and FIG. 5 through FIG. 7) is assembled in the portable electronic device, the MEMS microphone package (as shown in FIG. 1A and FIG. 5 through FIG. 7) can adopt a gasket to make one part of the acoustic holes (e.g., the first hole on the upper surface of the substrate) of the MEMS microphone package (as shown in FIG. 1A) faces a sound inlet on a surface of the casing of the portable electronic device. Moreover, under the condition that the assembly position of the MEMS microphone package in the portable electronic device is not changed, another gasket can be adopted to make another part of acoustic holes (e.g., the second hole on the electrically conductive cover) of the MEMS microphone package to face another sound inlet on another surface of the casing of the portable electronic device. Hence, due to the non-coplanar boundary of the acoustic holes of the MEMS microphone package according to the embodiments of the disclosure, the flexibility of the MEMS microphone package assembly in the portable electronic device is increased.

To sum up, in the MEMS microphone package according to the embodiments of the disclosure, the acoustic hole of the MEMS microphone package is formed by both the first hole of the substrate and the second hole of the electrically conductive cover. That is, both the quality of directional sound receiving and the low profile of the MEMS microphone package can be maintained without considering the limitation of thickness of the substrate.

What is claimed is:

1. A microelectromechanical system (MEMS) microphone package, comprising:
    a substrate, comprising:
        at least one first hole;
        an upper surface;
        a bottom surface;
        a side surface with two sides connected to the upper surface and the bottom surface, respectively, and the two sides being opposite to each other;
        at least one first electrically conductive layer disposed on the upper surface; and
        at least one second electrically conductive layer disposed on the bottom surface;
    at least one MEMS microphone electrically coupled to the substrate;
    at least one IC chip electrically coupled to the substrate; and
    an electrically conductive cover comprising at least one second hole;
    wherein, the electrically conductive cover is bonded to the substrate to form a chamber for accommodating the MEMS microphone and the IC chip, the at least one first hole and the at least one second hole together form at least one acoustic hole, the at least one acoustic hole has an opening on an outer surface of the MEMS microphone package, the opening has a first boundary and a second boundary, the first boundary of the opening is a part of a boundary of the at least one first hole, and the second boundary of the opening is a part of a boundary of the at least one second hole.

2. The MEMS microphone package according to claim 1, wherein the electrically conductive cover further comprises a top portion and a side portion, the side portion surrounds and is connected to the top portion, and the at least one second hole is disposed on the side portion.

3. The MEMS microphone package according to claim 2, wherein a boundary of the first hole is disposed on the upper surface, and the first hole is not in contact with the side surface and the bottom surface to form a blind hole.

4. The MEMS microphone package according to claim 2, wherein a boundary of the first hole is disposed on the upper surface and the bottom surface, and the first hole is not in contact with the side surface to form a through hole extending through the upper surface and the bottom surface.

5. The MEMS microphone package according to claim 2, wherein a boundary of the first hole is disposed on the upper surface and the side surface, and the first hole is not in contact with the bottom surface to form a peripheral blind hole.

6. The MEMS microphone package according to claim 2, wherein a boundary of the first hole is disposed on the upper surface, the bottom surface and the side surface to form a through hole on edge.

7. The MEMS microphone package according to claim 6, wherein the substrate further comprises at least one third electrically conductive layer, the at least one third electrically conductive layer is disposed on a surface of the first hole, and the at least one third electrically conductive layer is connected to the at least one first electrically conductive layer and the at least one second electrically conductive layer.

8. The MEMS microphone package according to claim 7, wherein the electrically conductive cover is electrically coupled to the at least one first electrically conductive layer, the at least one second electrically conductive layer is electrically coupled to a fourth electrically conductive layer such that the electrically conductive cover forms a shield for preventing electromagnetic interference.

9. The MEMS microphone package according to claim 1, wherein the electrically conductive cover further comprises a top portion, a side portion and a brim portion, the side portion surrounds and is connected to the top portion, the brim portion surrounds and is connected to the side portion, the at least one second hole is disposed on the brim portion.

10. The MEMS microphone package according to claim 9, wherein a boundary of the first hole is disposed on the upper surface, and the first hole is not contact with the side surface and the bottom surface to form a blind hole.

11. The MEMS microphone package according to claim 9, wherein a boundary of the first hole is disposed on the upper surface and the bottom surface, and the first hole is not in contact with the side surface to form a through hole extending through the upper surface and the bottom surface.

12. The MEMS microphone package according to claim 9, wherein a boundary of the first hole is disposed on the upper surface and the side surface, and the first hole is not in contact with the bottom surface to form a peripheral blind hole.

13. The MEMS microphone package according to claim 9, wherein a boundary of the first hole is disposed on the upper surface, the bottom surface and the side surface to form a through hole on edge.

14. The MEMS microphone package according to claim 13, wherein the substrate further comprises at least one third electrically conductive layer, the at least one third electrically conductive layer is disposed on a surface of the first hole, the at least one third electrically conductive layer is connected to the at least one first electrically conductive layer and the at least one second electrically conductive layer.

15. The MEMS microphone package according to claim 14, wherein the electrically conductive cover is electrically coupled to the at least one first electrically conductive layer, the at least one second electrically conductive layer is electrically coupled to a fourth electrically conductive layer outside the MEMS microphone package such that the electrically conductive cover forms a shield for preventing electromagnetic interference.

16. The MEMS microphone package according to claim 1, wherein the electrically conductive cover further comprises a top portion, a side portion and a brim portion, the side portion surrounds and is connected to the top portion, the brim portion surrounds and is connected to the side portion, a boundary of the at least one second hole extends from the brim portion to the side portion.

17. The MEMS microphone package according to claim 16, wherein a boundary of the first hole is disposed on the upper surface, and the first hole is not in contact with the side surface and the bottom surface to form a blind hole.

18. The MEMS microphone package according to claim 16, wherein a boundary of the first hole is disposed on the upper surface and the bottom surface, and the first hole is not in contact with the side surface to form a through hole extending through the upper surface and the bottom surface.

19. The MEMS microphone package according to claim 16, wherein a boundary of the first hole is disposed on the upper surface and the side surface, and the first hole is not in contact with the bottom surface to form a peripheral blind hole.

20. The MEMS microphone package according to claim 16, wherein a boundary of the first hole is disposed on the upper surface, the bottom surface and the side surface to form a through hole on edge.

21. The MEMS microphone package according to claim 20, wherein the substrate further comprises at least one third electrically conductive layer, the at least one third electrically conductive layer is disposed on a surface of the first hole, the at least one third electrically conductive layer is connected to the at least one first electrically conductive layer and the at least one second electrically conductive layer.

22. The MEMS microphone package according to claim 21, wherein the electrically conductive cover is electrically coupled to the at least one first electrically conductive layer, the at least one second electrically conductive layer is electrically coupled to a fourth electrically conductive layer outside of the MEMS microphone package such that the electrically conductive cover forms a shield for preventing electromagnetic interference.

23. The MEMS microphone package according to claim 1, further comprising at least one third electrically conductive layer disposed on at least one surface of the at least one first hole, the at least one third electrically conductive layer being electrically coupled to the electrically conductive cover, and the at least one third electrically conductive layer being electrically coupled to an electrical ground layer such that the electrically conductive cover and the at least one third electrically conductive layer forms a shield for preventing electromagnetic interference.

24. The MEMS microphone package according to claim 1, wherein the opening of the at least one acoustic hole further has a third boundary connected to the first boundary and the second boundary, and the third boundary of the opening is a part of a boundary of the first electrically conductive layer.

25. A microelectromechanical system (MEMS) microphone package, comprising:
    a substrate, comprising:
        at least one first hole;
        an upper surface;
        a bottom surface;
        a side surface with two sides connected to the upper surface and the bottom surface, respectively, and the two sides being opposite to each other;
        at least one first electrically conductive layer disposed on the upper surface; and
        at least one second electrically conductive layer disposed on the bottom surface;

at least one MEMS microphone electrically coupled to the substrate;
at least one IC chip electrically coupled to the substrate; and
an electrically conductive cover comprising at least one second hole;
wherein the electrically conductive cover is bonded to the substrate to form a chamber for accommodating the MEMS microphone and the IC chip, the at least one first hole and the at least one second hole together form at least one acoustic hole, the at least one acoustic hole has an opening on an outer surface of the MEMS microphone package, the opening has a first boundary and a second boundary, the first boundary of the opening is a part of a boundary of the at least one first hole and is disposed on the upper surface, the second boundary of the opening is a part of a boundary of the at least one second hole, and the part of the boundary of the at least one first hole and the part of the boundary of the at least one second hole is not on a same plane.

26. The MEMS microphone package according to claim 25, wherein the first hole is not in contact with the side surface and the bottom surface to form a blind hole.

27. The MEMS microphone package according to claim 25, wherein another part of the boundary of the first hole is disposed on the bottom surface, and the first hole is not in contact with the side surface to form a through hole extending through the upper surface and the bottom surface.

28. The MEMS microphone package according to claim 25, wherein another part of the boundary of the first hole is disposed on the side surface, and the first hole is not in contact with the bottom surface to form a peripheral blind hole.

29. The MEMS microphone package according to claim 25, wherein another part of boundary of the first hole is disposed on the bottom surface and the side surface to form a through hole on edge.

30. The MEMS microphone package according to claim 29, wherein the substrate further comprises at least one third electrically conductive layer, the at least one third electrically conductive layer is disposed on a surface of the first hole, and the at least one third electrically conductive layer is connected to the at least one first electrically conductive layer and the at least one second electrically conductive layer.

31. The MEMS microphone package according to claim 30, wherein the electrically conductive cover is electrically coupled to the at least one first electrically conductive layer, the at least one second electrically conductive layer is electrically coupled to a fourth electrically conductive layer outside the MEMS microphone package such that the electrically conductive cover forms a shield for preventing electromagnetic interference.

32. The MEMS microphone package according to claim 25, further comprising at least one third electrically conductive layer disposed on at least one surface of the at least one first hole, the at least one third electrically conductive layer is electrically coupled to the electrically conductive cover, and the at least one third electrically conductive layer is electrically coupled to an electrical ground layer such that the electrically conductive cover and the at least one third electrically conductive layer together form a shield for preventing electromagnetic interference.

33. The MEMS microphone package according to claim 25, wherein the opening of the at least one acoustic hole further has a third boundary connected to the first boundary and the second boundary, and the third boundary of the opening is a part of a boundary of the first electrically conductive layer.

34. A microelectromechanical system (MEMS) microphone package, comprising:
a substrate, comprising:
at least one first hole;
an upper surface;
a bottom surface;
a side surface with two sides connected to the upper surface and the bottom surface, respectively, wherein the two sides are opposite to each other;
at least one first electrically conductive layer disposed on the upper surface;
at least one second electrically conductive layer disposed on the bottom surface; and
at least one third electrically conductive layer;
at least one MEMS microphone electrically coupled to the substrate;
at least one IC chip electrically coupled to the substrate; and
an electrically conductive cover comprising at least one second hole;
wherein the electrically conductive cover is bonded to the substrate to form a chamber for accommodating the MEMS microphone and the IC chip, the at least one first hole and the at least one second hole together form at least one acoustic hole, the at least one acoustic hole has an opening on an outer surface of the MEMS microphone package, the opening has a first boundary and a second boundary, the first boundary of the opening is a part of a boundary of the at least one first hole, the second boundary of the opening is a part of a boundary of the at least one second hole, the at least one third electrically conductive layer is disposed on at least one surface of the first hole, the at least one third electrically conductive layer is electrically coupled to the electrically conductive cover, and the at least one third electrically conductive layer is electrically coupled to an electrical ground layer such that the electrically conductive cover and the at least one third electrically conductive layer form a shield for preventing electromagnetic interference.

35. The MEMS microphone package according to claim 34, wherein the electrically conductive cover further comprises a top portion and a side portion, the side portion surrounds and is connected to the top portion, and the at least one second hole is disposed on the side portion.

36. The MEMS microphone package according to claim 34, wherein the electrically conductive cover further comprises a top portion, a side portion and a brim portion, the side portion surrounds and is connected to the top portion, the brim portion surrounds and is connected to the side portion, and the at least one second hole is disposed on the brim portion.

37. The MEMS microphone package according to claim 36, wherein a boundary of the at least one second hole extends from the brim portion to the side portion.

38. The MEMS microphone package according to claim 34, wherein the electrically conductive cover is connected to the at least one first electrically conductive layer, the at least one first electrically conductive layer is connected to the at least one third electrically conductive layer, the at least one third electrically conductive layer is connected to the at least one second electrically conductive layer, the at least one second electrically conductive layer is connected to a fourth electrically conductive layer outside the MEMS microphone package such that the electrically conductive cover and the at least one third electrically conductive layer together form a shield for preventing electromagnetic interference.

39. The MEMS microphone package according to claim 34, wherein the opening of the at least one acoustic hole further has a third boundary connected to the first boundary and the second boundary, and the third boundary of the opening is a part of a boundary of the first electrically conductive layer.

* * * * *